US010777762B2

(12) United States Patent
Seo et al.

(10) Patent No.: US 10,777,762 B2
(45) Date of Patent: *Sep. 15, 2020

(54) LIGHT-EMITTING DEVICE, DISPLAY DEVICE, AND ELECTRONIC DEVICE WITH COLOR CONVERSION LAYERS

(71) Applicant: SEMICONDUCTOR ENERGY LABORATORY CO., LTD., Atsugi-Shi, Kanagawa-Ken (JP)

(72) Inventors: Satoshi Seo, Kanagawa (JP); Nobuharu Ohsawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/558,387

(22) Filed: Sep. 3, 2019

(65) Prior Publication Data

US 2020/0006688 A1    Jan. 2, 2020

Related U.S. Application Data

(63) Continuation of application No. 14/725,068, filed on May 29, 2015.

(30) Foreign Application Priority Data

May 30, 2014   (JP) .................................. 2014-112796
May 30, 2014   (JP) .................................. 2014-112849

(51) Int. Cl.
*H01L 51/50*        (2006.01)
*H01L 27/32*        (2006.01)
(Continued)

(52) U.S. Cl.
CPC ...... *H01L 51/5004* (2013.01); *H01L 27/3213* (2013.01); *H01L 51/5044* (2013.01); *H01L 27/322* (2013.01); *H01L 27/3209* (2013.01)

(58) Field of Classification Search
CPC combination set(s) only.
See application file for complete search history.

(56) References Cited

U.S. PATENT DOCUMENTS 6,121,726 A  *  9/2000  Codama ............. H01L 51/5036
                                                313/504
6,639,250 B1    10/2003  Shimoda et al.
(Continued)

FOREIGN PATENT DOCUMENTS

CN      001988205 A     6/2007
CN      103165645 A     6/2013
(Continued)

OTHER PUBLICATIONS

International Search Report (Application No. PCT/IB2015/053664) dated Aug. 18, 2015.
(Continued)

*Primary Examiner* — Nduka E Ojeh
(74) *Attorney, Agent, or Firm* — Fish & Richardson P.C.

(57) ABSTRACT

A light-emitting device, an electronic device, and a display device each consume less power are provided. The light-emitting device includes a first light-emitting element, a second light-emitting element, and a third light-emitting element that share an EL layer. The EL layer includes a layer containing a light-emitting material that emits blue fluorescence and a layer containing a light-emitting material that emits yellow or green phosphorescence. Light emitted from the second light-emitting element enters a color filter layer
(Continued)

or a second color conversion layer, and light emitted from the third light-emitting element enters a first color conversion layer.

7 Claims, 12 Drawing Sheets

(51) Int. Cl.
  *H01L 51/00* (2006.01)
  *H01L 29/08* (2006.01)
  *H01L 35/24* (2006.01)

(56) References Cited

U.S. PATENT DOCUMENTS

| | | | |
|---|---|---|---|
| 6,739,931 B2 | 5/2004 | Yamazaki et al. | |
| 6,995,511 B2 | 2/2006 | Yamazaki et al. | |
| 7,057,339 B2 | 6/2006 | Boroson et al. | |
| 7,399,991 B2 | 7/2008 | Seo et al. | |
| 7,459,849 B2 | 12/2008 | Yamazaki et al. | |
| 7,514,868 B2 | 4/2009 | Yamazaki et al. | |
| 7,531,856 B2 | 5/2009 | Kobori | |
| 7,919,783 B2 | 4/2011 | Ushikubo et al. | |
| 7,956,349 B2 | 6/2011 | Tsutsui et al. | |
| 8,044,588 B2 | 10/2011 | Yamazaki et al. | |
| 8,076,671 B2 | 12/2011 | Yamazaki et al. | |
| 8,421,352 B2 | 4/2013 | Yamazaki et al. | |
| 8,618,732 B2 | 12/2013 | Yamazaki et al. | |
| 9,006,755 B2 | 4/2015 | Seo et al. | |
| 9,142,710 B2 | 9/2015 | Seo et al. | |
| 9,178,158 B2 | 11/2015 | Kitano et al. | |
| 9,263,503 B2 | 2/2016 | Yamazaki et al. | |
| 9,269,920 B2 | 2/2016 | Yamazaki et al. | |
| 9,362,517 B2 | 6/2016 | Ohsawa et al. | |
| 9,368,742 B2 | 6/2016 | Kawata et al. | |
| 9,412,962 B2 | 8/2016 | Hamada et al. | |
| 9,496,503 B2 | 11/2016 | Takeda et al. | |
| 9,515,279 B2 | 12/2016 | Ishisone et al. | |
| 9,548,468 B2 | 1/2017 | Seo et al. | |
| 9,559,324 B2 | 1/2017 | Seo et al. | |
| 9,634,279 B2 | 4/2017 | Seo et al. | |
| 9,653,517 B2 | 5/2017 | Uesaka et al. | |
| 9,653,705 B2 | 5/2017 | Uesaka et al. | |
| 2007/0103056 A1* | 5/2007 | Cok | H01L 27/322 313/503 |
| 2007/0109571 A1 | 5/2007 | Kawamura | |
| 2007/0138947 A1 | 6/2007 | Popovic et al. | |
| 2007/0145350 A1 | 6/2007 | Kobori | |
| 2007/0200492 A1* | 8/2007 | Cok | H01L 27/322 313/506 |
| 2007/0205423 A1* | 9/2007 | Yamazaki | H01L 27/3213 257/89 |
| 2008/0129195 A1* | 6/2008 | Ishizaki | H01L 27/322 313/504 |
| 2008/0272690 A1 | 11/2008 | Kuma et al. | |
| 2009/0091241 A1* | 4/2009 | Tsou | H01L 27/322 313/504 |
| 2012/0187394 A1* | 7/2012 | Hatano | G09G 3/3208 257/43 |
| 2012/0205632 A1 | 8/2012 | Shitagaki et al. | |
| 2013/0146903 A1 | 6/2013 | Ichikawa et al. | |
| 2014/0014960 A1 | 1/2014 | Yamazaki et al. | |
| 2014/0034932 A1 | 2/2014 | Seo et al. | |
| 2014/0084274 A1 | 3/2014 | Yamazaki et al. | |
| 2014/0319492 A1 | 10/2014 | Seo et al. | |
| 2015/0214281 A1* | 7/2015 | Hack | H01L 27/3209 257/40 |
| 2015/0333283 A1 | 11/2015 | Ishisone et al. | |
| 2016/0028022 A1 | 1/2016 | Seo et al. | |
| 2016/0093823 A1 | 3/2016 | Seo et al. | |
| 2016/0248031 A1 | 8/2016 | Seo | |
| 2016/0268536 A1 | 9/2016 | Ohsawa et al. | |
| 2016/0308156 A1 | 10/2016 | Kawata et al. | |
| 2016/0343942 A1 | 11/2016 | Hamada et al. | |
| 2016/0343949 A1 | 11/2016 | Seo et al. | |
| 2016/0343954 A1 | 11/2016 | Seo et al. | |
| 2016/0372688 A1 | 12/2016 | Seo et al. | |
| 2017/0025615 A1 | 1/2017 | Seo et al. | |
| 2017/0025630 A1 | 1/2017 | Seo et al. | |
| 2017/0053970 A1 | 2/2017 | Ishisone et al. | |
| 2017/0092889 A1 | 3/2017 | Seo et al. | |
| 2017/0117497 A1 | 4/2017 | Seo et al. | |
| 2017/0141339 A1 | 5/2017 | Seo et al. | |
| 2017/0213991 A1 | 7/2017 | Uesaka et al. | |

FOREIGN PATENT DOCUMENTS

| | | |
|---|---|---|
| DE | 102013213552 | 1/2014 |
| JP | 10-162958 A | 6/1998 |
| JP | 10-171375 A | 6/1998 |
| JP | 2002-164181 A | 6/2002 |
| JP | 2003-264081 A | 9/2003 |
| JP | 2003264081 A * | 9/2003 |
| JP | 2004-158469 A | 6/2004 |
| JP | 2006-338910 A | 12/2006 |
| JP | 2007-173827 A | 7/2007 |
| JP | 2008-218320 A | 9/2008 |
| JP | 2008-300503 A | 12/2008 |
| JP | 2009-129586 A | 6/2009 |
| JP | 2011-134734 A | 7/2011 |
| JP | 2013-122836 A | 6/2013 |
| JP | 2013-131743 A | 7/2013 |
| JP | 2014-032960 A | 2/2014 |
| JP | 2014-052606 A | 3/2014 |
| JP | 2015-026417 A | 2/2015 |
| KR | 2007-0067606 A | 6/2007 |
| KR | 2014-0009024 A | 1/2014 |
| TW | I352556 | 11/2011 |
| TW | 201407225 | 2/2014 |
| WO | WO-2011/145358 | 11/2011 |
| WO | WO-2013/073521 | 5/2013 |

OTHER PUBLICATIONS

Written Opinion (Application No. PCT/IB2015/053664) dated Aug. 18, 2015.

* cited by examiner

LIGHT-EMITTING DEVICE, DISPLAY DEVICE, AND ELECTRONIC DEVICE WITH COLOR CONVERSION LAYERS

CROSS-REFERENCE TO RELATED APPLICATIONS

This application is a continuation application Ser. No. 14/725,068, filed May 29, 2015, now allowed, which claims the benefit of a foreign priority applications filed in Japan as Serial No. 2014-112796 on May 30, 2014, and Serial No. 2014-112849 on May 30, 2014, all of which are incorporated by reference.

TECHNICAL FIELD

One embodiment of the present invention relates to a light-emitting device, a display device, a display module, a lighting module, an electronic device, and a lighting device. Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

BACKGROUND ART

As next-generation lighting devices or display devices, devices using light-emitting elements (organic EL elements) in which organic compounds are used as light-emitting substances have been developed and commercialized because of their potential for thinness, lightness, high speed response to input signals, low power consumption, and the like.

In an organic EL element, voltage application between electrodes, between which a light-emitting layer is interposed, causes recombination of electrons and holes injected from the electrodes, which brings a light-emitting substance (an organic compound) into an excited state, and the return from the excited state to the ground state is accompanied by light emission. Since the spectrum of light emitted from a light-emitting substance depends on the light-emitting substance, use of different types of organic compounds as light-emitting substances makes it possible to obtain light-emitting elements that exhibit various colors.

For display devices that are expected to display images, such as displays, at least three-color light, i.e., red light, green light, and blue light are necessary to reproduce full-color images. For higher color reproducibility and higher quality of the display images, the color purity of emitted light is increased with the use of a microcavity structure or a color filter.

Furthermore, a variety of measures, such as changing molecular structures of light-emitting materials to be used and adjusting the materials or the compositions of materials of a light-emitting element and the structure of a light-emitting element, are taken to reduce power consumption.

REFERENCE

Patent Document

[Patent Document 1] Japanese Published Patent Application No. 2009-129586

DISCLOSURE OF INVENTION

An object of one embodiment of the present invention is to provide a novel light-emitting device. Another object of one embodiment of the present invention is to provide a light-emitting device with low power consumption. Another object of one embodiment of the present invention is to provide an electronic device and a display device each with low power consumption.

It is only necessary that at least one of the above-described objects be achieved in one embodiment of the present invention.

In one embodiment of the present invention, the object can be achieved by obtaining a desired emission color with the use of a color conversion layer in a light-emitting device using an organic compound as a light-emitting material.

One embodiment of the present invention is a light-emitting device with light-emitting elements using an organic compound. The light-emitting device includes at least a first light-emitting element, a second light-emitting element, and a third light-emitting element. The first light-emitting element, the second light-emitting element, and the third light-emitting element share an EL layer. The EL layer includes a layer containing a light-emitting material that emits blue fluorescence and a layer containing a light-emitting material that emits green phosphorescence. Light emitted from the third light-emitting element enters a first color conversion layer.

Another embodiment of the present invention is the light-emitting device having the above-described structure, in which light emitted from the first light-emitting element is extracted from the light-emitting device through a color filter that transmits blue light.

Another embodiment of the present invention is the light-emitting device having the above-described structure, in which light emitted from the second light-emitting element is extracted from the light-emitting device through a color filter that transmits green light.

Another embodiment of the present invention is the light-emitting device having the above-described structure, in which light emitted from the second light-emitting element enters a second color conversion layer that emits green light.

Another embodiment of the present invention is the light-emitting device having the above-described structure, in which the first light-emitting element, the second light-emitting element, and the third light-emitting element are tandem light-emitting elements.

Another embodiment of the present invention is the light-emitting device having the above-described structure, in which the layer containing the light-emitting material that emits blue fluorescence and the layer containing the light-emitting material that emits green phosphorescence are adjacent to each other in the first light-emitting element, the second light-emitting element, and the third light-emitting element.

Another embodiment of the present invention is the light-emitting device having the above-described structure, in which the PL quantum yield of at least one of the first color conversion layer and the second color conversion layer is higher than 40%.

Another embodiment of the present invention is the light-emitting device having the above-described structure, in which the PL quantum yield of at least one of the first color conversion layer and the second color conversion layer is higher than 53.3%.

Another embodiment of the present invention is the light-emitting device having the above-described structure, in which the PL quantum yield of at least one of the first color conversion layer and the second color conversion layer is higher than 66%.

Another embodiment of the present invention is a light-emitting device with a light-emitting element using an organic compound, which has the following characteristics. The light-emitting device includes at least a first light-emitting element, a second light-emitting element, and a third light-emitting element. The first light-emitting element includes an EL layer with a first structure. The second light-emitting element and the third light-emitting element include an EL layer with a second structure. The EL layer with the first structure includes a layer containing a light-emitting material that emits blue fluorescence and a layer containing a light-emitting material that emits green phosphorescence. The EL layer with the second structure includes the layer containing the light-emitting material that emits green phosphorescence. Light emitted from the third light-emitting element enters a first color conversion layer.

Another embodiment of the present invention is the light-emitting device having the above-described structure, in which the layer containing the light-emitting material that emits blue fluorescence is closer to an anode than the layer containing the light-emitting material that emits green phosphorescence is, and the layer containing the light-emitting material that emits blue fluorescence and the layer containing the light-emitting material that emits green phosphorescence each have an electron-transport property higher than a hole-transport property.

Another embodiment of the present invention is the light-emitting device having the above-described structure, in which the layer containing the light-emitting material that emits blue fluorescence is closer to a cathode than the layer containing the light-emitting material that emits green phosphorescence is, and the layer containing the light-emitting material that emits blue fluorescence and the layer containing the light-emitting material that emits green phosphorescence each have a hole-transport property higher than an electron-transport property.

Another embodiment of the present invention is a light-emitting device with a light-emitting element using an organic compound, which has the following characteristics. The light-emitting device includes at least a first light-emitting element, a second light-emitting element, and a third light-emitting element. The first light-emitting element includes an EL layer with a third structure. The second light-emitting element and the third light-emitting element include an EL layer with a fourth structure. The EL layer with the fourth structure includes a layer containing a light-emitting material that emits blue fluorescence and a layer containing a light-emitting material that emits green phosphorescence. The EL layer with the third structure includes the layer containing the light-emitting material that emits blue fluorescence. Light emitted from the third light-emitting element enters a first color conversion layer.

Another embodiment of the present invention is the light-emitting device having the above-described structure, in which the layer containing the light-emitting material that emits blue fluorescence is closer to an anode than the layer containing the light-emitting material that emits green phosphorescence is, and the layer containing the light-emitting material that emits blue fluorescence and the layer containing the light-emitting material that emits green phosphorescence each have a hole-transport property higher than an electron-transport property.

Another embodiment of the present invention is the light-emitting device having the above-described structure, in which the layer containing the light-emitting material that emits blue fluorescence is closer to a cathode than the layer containing the light-emitting material that emits green phosphorescence is, and the layer containing the light-emitting material that emits blue fluorescence and the layer containing the light-emitting material that emits green phosphorescence each have an electron-transport property higher than a hole-transport property.

Another embodiment of the present invention is the light-emitting device having the above-described structure, in which the PL quantum yield of the first color conversion layer is higher than 50%.

Another embodiment of the present invention is the light-emitting device having the above-described structure, in which the layer containing the light-emitting material that emits green phosphorescence further contains a first organic compound and a second organic compound, and the first organic compound and the second organic compound form an exciplex.

Another embodiment of the present invention is the light-emitting device having the above-described structure, in which an emission spectrum of the exciplex overlaps with an absorption band on the longest wavelength side of the light-emitting material that emits green phosphorescence.

Another embodiment of the present invention is a light-emitting device with a light-emitting element using an organic compound, which has the following characteristics. The light-emitting device includes at least a first light-emitting element, a second light-emitting element, and a third light-emitting element. The first light-emitting element, the second light-emitting element, and the third light-emitting element share an EL layer. The EL layer includes a light-emitting material that emits blue fluorescence and a light emitting material that emits yellow phosphorescence. Light emitted from the second light-emitting element enters a second color conversion layer, and light emitted from the third light-emitting element enters a first color conversion layer.

Another embodiment of the present invention is the light-emitting device having the above-described structure, in which light emitted from the first light-emitting element is extracted from the light-emitting device through a color filter that transmits blue light.

Another embodiment of the present invention is the light-emitting device having the above-described structure, in which the second light-emitting element includes a microcavity structure that amplifies blue light.

Another embodiment of the present invention is the light-emitting device having the above-described structure, in which the first light-emitting element, the second light-emitting element, and the third light-emitting element are tandem light-emitting elements.

Another embodiment of the present invention is the light-emitting device having the above-described structure, in which the layer containing the light-emitting material that emits blue fluorescence and the layer containing the light-emitting material that emits yellow phosphorescence are adjacent to each other in the first light-emitting element, the second light-emitting element, and the third light-emitting element.

Another embodiment of the present invention is the light-emitting device having the above-described structure, in which the PL quantum yield of the first color conversion layer is higher than 40%.

Another embodiment of the present invention is the light-emitting device having the above-described structure, in which the PL quantum yield of the first color conversion layer is higher than 50%.

Another embodiment of the present invention is the light-emitting device having the above-described structure, in which the PL quantum yield of the first color conversion layer is higher than 53.3%.

Another embodiment of the present invention is the light-emitting device having the above-described structure, in which the PL quantum yield of the first color conversion layer is higher than 66%.

Another embodiment of the present invention is a light-emitting device with a light-emitting element using an organic compound, which has the following characteristics. The light-emitting device includes at least a first light-emitting element, a second light-emitting element, and a third light-emitting element. The first light-emitting element and the second light-emitting element include an EL layer with a fifth structure. The third light-emitting element includes an EL layer with a sixth structure. The EL layer with the fifth structure includes a layer containing a light-emitting material that emits blue fluorescence and a layer containing a light-emitting material that emits yellow phosphorescence. The EL layer with the sixth structure includes the layer containing the light-emitting material that emits yellow phosphorescence. Light emitted from the second light-emitting element enters a second color conversion layer, and light emitted from the third light-emitting element enters a first color conversion layer.

Another embodiment of the present invention is the light-emitting device having the above-described structure, in which the layer containing the light-emitting material that emits blue fluorescence is closer to an anode than the layer containing the light-emitting material that emits yellow phosphorescence is, and the layer containing the light-emitting material that emits blue fluorescence and the layer containing the light-emitting material that emits yellow phosphorescence each have an electron-transport property higher than a hole-transport property.

Another embodiment of the present invention is the light-emitting device having the above-described structure, in which the layer containing the light-emitting material that emits blue fluorescence is closer to a cathode than the layer containing the light-emitting material that emits yellow phosphorescence is, and the layer containing the light-emitting material that emits blue fluorescence and the layer containing the light-emitting material that emits yellow phosphorescence each have a hole-transport property higher than an electron-transport property.

Another embodiment of the present invention is the light-emitting device having the above-described structure, further including a fourth light-emitting element, in which light emitted from the fourth light-emitting element is extracted from the light-emitting device through a color filter that transmits yellow light.

Another embodiment of the present invention is a light-emitting device with a light-emitting element using an organic compound, which has the following characteristics. The light-emitting device includes at least a first light-emitting element, a second light-emitting element, and a third light-emitting element. The first light-emitting element and the second light-emitting element include an EL layer with a seventh structure, and the third light-emitting element includes an EL layer with an eighth structure. The EL layer with the eighth structure includes a layer containing a light-emitting material that emits blue fluorescence and a layer containing a light-emitting material that emits yellow phosphorescence. The EL layer with the seventh structure includes the layer containing the light-emitting material that emits blue fluorescence. Light emitted from the second light-emitting element enters a second color conversion layer, and light emitted from the third light-emitting element enters a first color conversion layer.

Another embodiment of the present invention is the light-emitting device having the above-described structure, in which the layer containing the light-emitting material that emits blue fluorescence is closer to an anode than the layer containing the light-emitting material that emits yellow phosphorescence is, and the layer containing the light-emitting material that emits blue fluorescence and the layer containing the light-emitting material that emits yellow phosphorescence each have a hole-transport property higher than an electron-transport property.

Another embodiment of the present invention is the light-emitting device having the above-described structure, in which the layer containing the light-emitting material that emits blue fluorescence is closer to a cathode than the layer containing the light-emitting material that emits yellow phosphorescence is, and the layer containing the light-emitting material that emits blue fluorescence and the layer containing the light-emitting material that emits yellow phosphorescence each have an electron-transport property higher than a hole-transport property.

Another embodiment of the present invention is the light-emitting device having the above-described structure, further including a fourth light-emitting element including the EL layer with the fourth structure, in which light emitted from the fourth light-emitting element is extracted from the light-emitting device through a color filter that transmits yellow light.

Another embodiment of the present invention is the light-emitting device having the above-described structure, in which the PL quantum yield of the first color conversion layer is greater than or equal to 50%.

Another embodiment of the present invention is the light-emitting device having the above-described structure, in which the second color conversion layer emits green light.

Another embodiment of the present invention is the light-emitting device having the above-described structure, in which the layer containing the light-emitting material that emits yellow phosphorescence further contains a first organic compound and a second organic compound, and the first organic compound and the second organic compound form an exciplex.

Another embodiment of the present invention is the light-emitting device having the above-described structure, in which an emission spectrum of the exciplex overlaps with an absorption band on the longest wavelength side of the light-emitting material that emits yellow phosphorescence.

Another embodiment of the present invention is the light-emitting device having the above-described structure, in which the first color conversion layer emits red light.

Another embodiment of the present invention is the light-emitting device having the above-described structure further including a fourth light-emitting element, in which light emitted from the fourth light-emitting element enters a third color conversion layer, and the third color conversion layer emits yellow light.

Another embodiment of the present invention is the light-emitting device having the above-described structure, in which the first color conversion layer includes quantum dots.

Another embodiment of the present invention is an electronic device including the light-emitting device having the above-described structure and at least one of a sensor, an operation button, a speaker, and a microphone.

According to one embodiment of the present invention, a novel light-emitting device can be provided. According to one embodiment of the present invention, a light-emitting device with low power consumption can be provided. According to another embodiment of the present invention, a display device and an electronic device each with low power consumption can be provided.

It is only necessary that at least one of the effects from the above objects be achieved in one embodiment of the present invention.

BRIEF DESCRIPTION OF DRAWINGS

In the accompanying drawings:
FIGS. 10A, 10B1, 10B2, 10C, and 10D illustrate electronic devices.

BEST MODE FOR CARRYING OUT THE INVENTION

Embodiments of the present invention will be explained in detail below with reference to the drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Drawings for illustrating embodiments of the present invention are shown in FIGS. 1A to 1D, FIGS. 2A to 2D, FIGS. 3A to 3D, and FIGS. 4A to 4D.

<Conversion from Tandem Element Utilizing Blue Fluorescence and Green Phosphorescence>

Figure 1A:
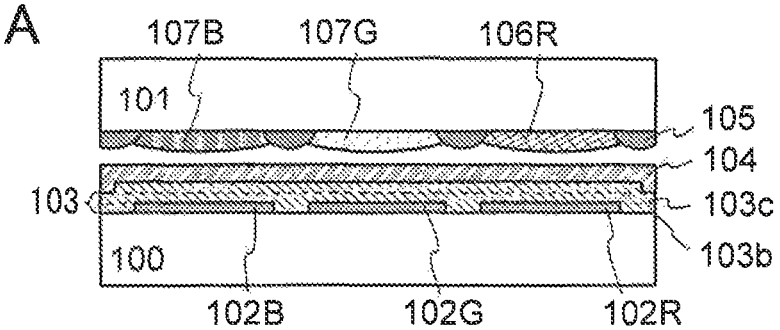
FIGS. 1A to 1D are conceptual diagrams of light-emitting devices.

FIG. 1A shows a light-emitting device of one embodiment of the present invention using a tandem element utilizing blue fluorescence and green phosphorescence. The light-emitting device includes at least a first light-emitting element, a second light-emitting element, and a third light-emitting element that are provided over a substrate 100. The first to third light-emitting elements share an EL layer 103 and a second electrode 104, and each have a different first electrode. The first light-emitting element, the second light-emitting element, and the third light-emitting element include a first electrode 102B, a first electrode 102G, and a first electrode 102R, respectively. A sealing substrate 101 is provided with a black matrix 105, a color filter 107B, a color filter 107G, and a color conversion layer 106R. The color filter 107B transmits blue light, and the color filter 107G transmits green light. The color conversion layer 106R contains a color conversion substance that emits red light.

Figure 5A:
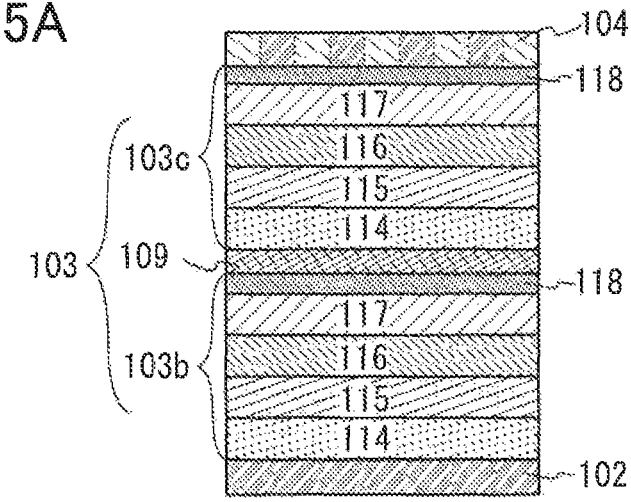
FIGS. 5A to 5C are conceptual diagrams of light-emitting elements.

In FIG. 1A, the EL layer 103 has a tandem structure, a typical example of which is shown in FIG. 5A. The tandem structure refers to a structure in which a first light-emitting unit 103b and a second light-emitting unit 103c are stacked with an intermediate layer 109 that is a charge generation layer positioned therebetween. Supposing a first electrode 102 is an anode and the second electrode 104 is a cathode, each light-emitting unit typically has a structure where a hole-injection layer 114, a hole-transport layer 115, a light-emitting layer 116, an electron-transport layer 117, an electron-injection layer 118, and the like are stacked in this order from the first electrode 102 (here, an anode) side. With such a structure, a light-emitting material is contained in the light-emitting layer 116. In the case where the first electrode 102 is the cathode and the second electrode 104 is the anode, the above-described order of stack in the EL layer is reversed. Note that the EL layer 103 is shared by the first to third light-emitting elements.

One of the first light-emitting unit 103b and the second light-emitting unit 103c emits blue fluorescence, and the other emits green phosphorescence. Light in which blue fluorescence and green phosphorescence are synthesized is obtained from the EL layer 103. The light-emitting layer included in each of the light-emitting units contains a first organic compound as a host material, in addition to the light-emitting material. Furthermore, the light-emitting layer also contains a second organic compound and it is preferable that the first organic compound and the second organic compound form an exciplex and energy transfer occur from the exciplex to the light-emitting material. In addition, the emission spectrum of the exciplex and the absorption band of the light-emitting material on the longest wavelength side preferably overlap with each other, which enables energy transfer with favorable efficiency.

Light emitted from the first light-emitting element is extracted outside the light-emitting device through the color filter 107B. Light emitted from the second light-emitting element is extracted outside the light-emitting device through the color filter 107G. Light emitted from the third light-emitting element enters the color conversion layer 106R, and the color conversion layer 106R is excited by the entering light and emits red light.

Here, the external quantum efficiency of each pixel (a light-emitting element with components such as a color filter, a color conversion layer, and a substrate, which affect the extraction efficiency is referred to as a pixel, in this specification) in the light-emitting device having the above structure and the external quantum efficiency of each pixel in a light-emitting device having a structure different from the above will be considered. Note that the carrier balance, exciton generation probability, and the like in light-emitting elements used in the light-emitting devices are assumed to be similar.

First, the external quantum efficiency of each pixel in the light-emitting device having a structure different from the above will be calculated. In order to efficiently obtain red, green, and blue colors with a light-emitting device using a tandem element, in general, the use of light-emitting materials having respective light emission wavelengths is effective. In view of the practicality and efficiency, a blue fluorescent material, a red phosphorescent material, and a green phosphorescent material are often used. A double tandem structure having two light-emitting units, which is the same as FIG. 5A, is employed. The light-emitting layer of one of the light-emitting units is a fluorescent layer using a blue fluorescent material, and the light-emitting layer of the other light-emitting unit is a phosphorescent layer using a red phosphorescent material and a green phosphorescent material.

In the light-emitting element having such a structure, the internal quantum efficiency of the fluorescent layer and that of the phosphorescent layer are assumed to be 25% and 100%, respectively. Then, the external quantum efficiency of a blue pixel is $25 \times \chi_{CF}$ % (note that $\chi_{CF}$ is the light extraction efficiency with a color filter used, and $\chi_{CF}$ is assumed to be the maximum value of the transmittance of the used color filter multiplied by $\chi_A$; and $\chi_A$ is the light extraction efficiency from which the transmittance of a color filter or the PL quantum efficiency of a color conversion layer is removed, and assumed to be common to all the pixels in the light-emitting device). The external quantum efficiency of a green pixel and that of a red pixel are each $50 \times \chi_{CF}$ % (it is because excitons are divided between green and red; for simplicity, excitons are assumed to be divided half and half).

Next, for the light-emitting device having the structure shown in FIG. 1A, the external quantum efficiency of a blue pixel is $25 \times \chi_{CF}$ %, the external quantum efficiency of a green pixel is $100 \times \chi_{CF}$ % (the phosphorescent layer is a single layer of green; in the case where a color filter is not provided, it is $100 \times \chi_A$ %), and the external quantum efficiency of a red pixel is $125 \times \chi_{CC}$ (note that $\chi_{CC}$ is the light extraction efficiency with a color conversion layer used, and $\chi_{CC}$ is assumed to be the PL quantum yield of the used color conversion layer multiplied by $\chi_A$; and $125 \times \chi_{CC}$ % is obtained because green phosphorescence with the internal quantum efficiency of 100% and blue fluorescence with the internal quantum efficiency of 25% are color-converted).

Here, the external quantum efficiency of the green pixel with the structure of this embodiment is $100 \times \chi_{CF}$ %, whereas that with the conventional structure is $50 \times \chi_{CF}$ %, which means that the green pixel with the structure of this embodiment is expected to double the external quantum efficiency. Furthermore, the external quantum efficiency of the red pixel with the structure of this embodiment is $125 \times \chi_{CC}$ %, whereas that with the conventional structure is $50 \times \chi_{CF}$ %, which means that the external quantum efficiency of the red pixel with the structure of this embodiment is expected to be 2.5 times that with the conventional structure, in the case where the transmittance of the color filter and the PL quantum yield of the color conversion layer are the same. Accordingly, as long as the PL quantum yield of the color conversion layer is greater than or equal to 40% of the transmittance of the color filter, a red pixel with the external quantum efficiency higher than that of the conventional red pixel can be obtained, and power consumption of the light-emitting device can be reduced. Note that the color filter 107G that transmits green light may be replaced by a color conversion layer 106G. In that case, the external quantum efficiency of the green pixel is $125 \times \chi_{CC}$ % as that of the red pixel is, and as long as the PL quantum yield $\chi_{CC}$ of the color conversion layer is greater than or equal to 40% of the transmittance $\chi_{CF}$ of the color filter, the green pixel with higher external quantum efficiency than that of the conventional green pixel can be obtained and power consumption of the light-emitting device can be reduced.

Figure 2A:
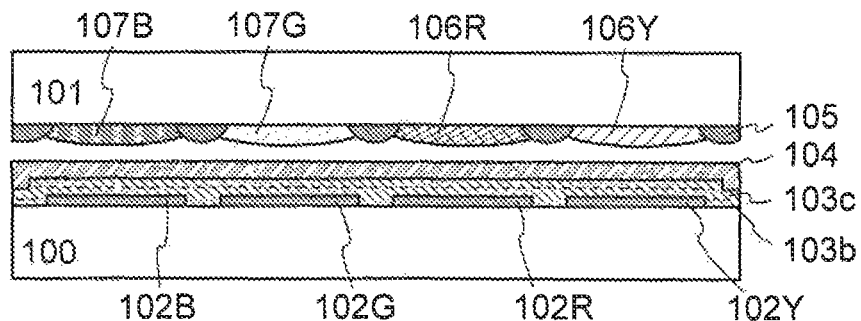
FIGS. 2A to 2D are conceptual diagrams of light-emitting devices.

As shown in FIG. 2A, a fourth light-emitting element that constitutes a yellow pixel may be added to the structure shown in FIG. 1A. The fourth light-emitting element includes the EL layer including the first light-emitting unit 103b and the second light-emitting unit 103c between a first electrode 102Y and the second electrode 104. Light emitted from the fourth light-emitting element enters a color conversion layer 106Y, and the color conversion layer 106Y emits yellow light. The external quantum efficiency of the yellow pixel is $125 \times \chi_{CC}$ % because the yellow light is obtained by color-converting blue fluorescence with the internal quantum efficiency of 25% and green phosphorescence with the internal quantum efficiency of 100%.

The light-emitting device having such a structure can express an image with four colors, i.e., red, green, blue, and yellow, and is excellent in color reproducibility. In addition, since yellow light has a high luminosity factor, power consumption can be reduced.

<Conversion from Single Element Utilizing Blue Fluorescence and Green Phosphorescence>

Figure 1B:
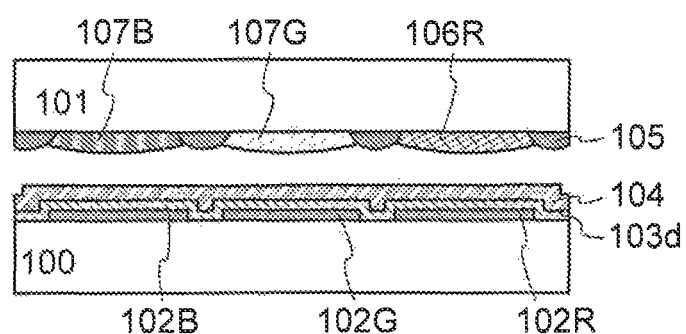

FIG. 1B shows a light-emitting device of one embodiment of the present invention using a single element utilizing blue fluorescence and green phosphorescence. As with the light-emitting device shown in FIG. 1A, the light-emitting device includes at least a first light-emitting element, a second light-emitting element, and a third light-emitting element. A substrate 100, a sealing substrate 101, first electrodes 102B, 102G, and 102R, a second electrode 104, a black matrix 105, a color conversion layer 106R, a color filter 107G, and a color filter 107B are also similar to those of the light-emitting device shown in FIG. 1A; therefore, the description is omitted here.

Figure 5B:
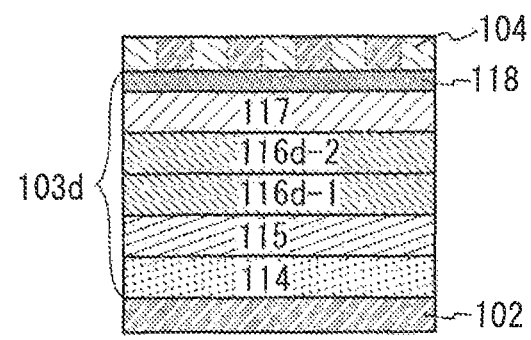

In FIG. 1B, an EL layer 103d has a single structure in which two light-emitting layers (a first light-emitting layer 116d-1 and a second light-emitting layer 116d-2) are adjacent to each other in one light-emitting unit, a typical example of which is shown in FIG. 5B. The first light-emitting layer 116d-1 and the second light-emitting layer 116d-2 may be formed in contact with each other, or a separation layer with a thickness of less than or equal to 20 nm may be provided therebetween. The thickness of the separation layer is preferably greater than or equal to 1 nm and less than or equal to 10 nm. Note that the EL layer 103d is shared by the first to third light-emitting elements.

In this structure, one of the first light-emitting layer 116d-1 and the second light-emitting layer 116d-2 in FIG. 5B emits blue fluorescence, and the other emits green phosphorescence. Light in which blue fluorescence and green phosphorescence are synthesized is obtained from the EL layer 103d. The first light-emitting layer 116d-1 and the second light-emitting layer 116d-2 each contain a first organic compound as a host material, in addition to a light-emitting material. Furthermore, the first light-emitting layer 116d-1 and the second light-emitting layer 116d-2 each contain a second organic compound as well, and it is preferable that the first organic compound and the second organic compound form an exciplex and energy transfer occur from the exciplex to the light-emitting materials. In addition, the emission spectrum of the exciplex and the absorption band of the light-emitting material on the longest wavelength side preferably overlap with each other, which enables energy transfer with favorable efficiency.

Light emitted from the first light-emitting element is extracted outside the light-emitting device through the blue color filter 107B. Light emitted from the second light-emitting element is extracted outside the light-emitting device through the green color filter 107G. Light emitted from the third light-emitting element enters the color conversion layer 106R, and the color conversion layer 106R is excited by the entering light and emits red light.

Here, the external quantum efficiency of each pixel in the light-emitting device having the above structure and the external quantum efficiency of each pixel in a light-emitting device having a structure different from the above will be considered. Note that the carrier balance, exciton generation probability, and the like in light-emitting elements used in the light-emitting devices are assumed to be similar.

First, the external quantum efficiency of each pixel in the light-emitting device having a structure different from the above will be calculated. In order to obtain red, green, and blue colors with the light-emitting device using light-emitting elements having a single-structure EL layer in which two light-emitting layers are adjacent to each other in one light-emitting unit, without the use of a color conversion layer, light-emitting materials that emit light with intensity at the wavelengths corresponding to the colors are required. If a blue fluorescent material, a red phosphorescent material, and a green phosphorescent material are used in view of the practicality and efficiency; it is preferable that the blue fluorescent material be used for one of the first light-emitting layer 116d-1 and the second light-emitting layer 116d-2, and that the red phosphorescent material and the green phosphorescent material be used for the other. Assuming that the internal quantum efficiency of a fluorescent layer in the light-emitting element is 25%, the internal quantum efficiency of a phosphorescent layer in the light-emitting element is 100%, and excitons are divided equally between blue, green, and red; the external quantum efficiency of a blue pixel is $8.3 \times \chi_{CF}$ %, and the external quantum efficiency of a green pixel and that of a red pixel are each $33.3 \times \chi_{CF}$ %.

Next, the light-emitting device having the structure shown in FIG. 1B will be considered. In addition to the assumption similar to the above, it is assumed that excitons are divided equally between blue and green; thus, the external quantum efficiency of the blue pixel is $12.5 \times \chi_{CF}$ %, the external quantum efficiency of the green pixel is $50 \times \chi_{CF}$ %, and the external quantum efficiency of the red pixel is $62.5 \times \chi_{CC}$ %. In this way, the use of the structure of one embodiment of the present invention provides a light-emitting element with much higher efficiency than that of the conventional element. Note that the color filter 107G that transmits green light can be replaced by a color conversion layer 106G. In that case, the external quantum efficiency of the green pixel is $62.5 \times \chi_{CC}$ % as that of the red pixel is.

Here, the external quantum efficiency of each pixel with the conventional structure and each pixel with the structure of this embodiment will be compared. The external quantum efficiency of the blue pixel with the structure of this embodiment is $12.5 \times \chi_{CF}$ % whereas that with the conventional structure is $8.3 \times \chi_{CF}$ %, which means that the external quantum efficiency of the blue pixel with the structure of this embodiment is expected to be approximately 1.5 times that with the conventional structure. The external quantum efficiency of the green pixel with the structure of this embodiment is $50 \times \chi_{CF}$ % whereas that with the conventional structure is $33 \times \chi_{CF}$ %, which means that the external quantum efficiency of the green pixel with the structure of this embodiment is expected to be also approximately 1.5 times that with the conventional structure. The external quantum efficiency of the red pixel with the structure of this embodiment is $62.5 \times \chi_{CC}$ % whereas that with the conventional structure is $33 \times \chi_{CF}$ %, which means that the external quantum efficiency of the red pixel with the structure of this embodiment is expected to be approximately 1.88 times that with the conventional structure in the case where the transmittance of the color filter and the PL quantum yield of the color conversion layer are the same. Accordingly, as long as the PL quantum yield of the color conversion layer is greater than or equal to 53.3% of the transmittance of the color filter, a red pixel with the external quantum efficiency higher than that of the conventional red pixel can be obtained, and power consumption of the light-emitting device can be reduced.

Figure 2B:
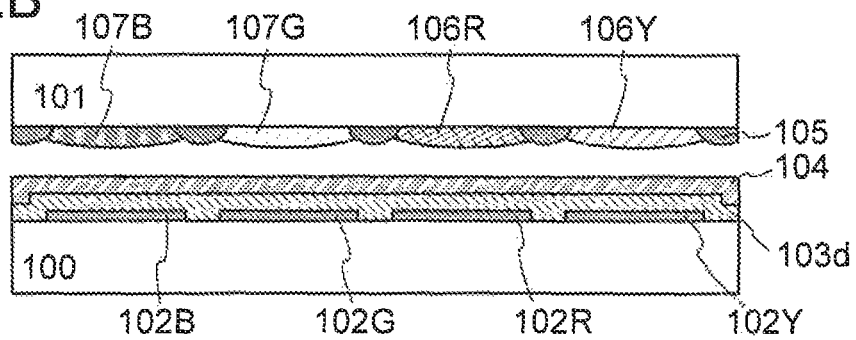

As shown in FIG. 2B, a fourth light-emitting element that constitutes a yellow pixel may be added to the structure shown in FIG. 1B. The fourth light-emitting element includes the EL layer with a single structure in which two light-emitting layers (the first light-emitting layer 116d-1 and the second light-emitting layer 116d-2) are adjacent to each other, between a first electrode 102Y and the second electrode 104. Light emitted from the fourth light-emitting element enters a color conversion layer 106Y, and the color conversion layer 106Y emits yellow light. The external quantum efficiency of the yellow pixel is $62.5 \times \chi_{CC}$ % because the yellow light is obtained by color-converting blue fluorescence and green phosphorescence.

The light-emitting device having such a structure can express an image with four colors, i.e., red, green, blue, and yellow, and is excellent in color reproducibility. In addition, since yellow light has a high luminosity factor, power consumption can be reduced.

<Conversion from Single Element of Blue Fluorescence and Single Element of Green Phosphorescence (One Selective Deposition Step Using Mask) 1>

Figure 1C:
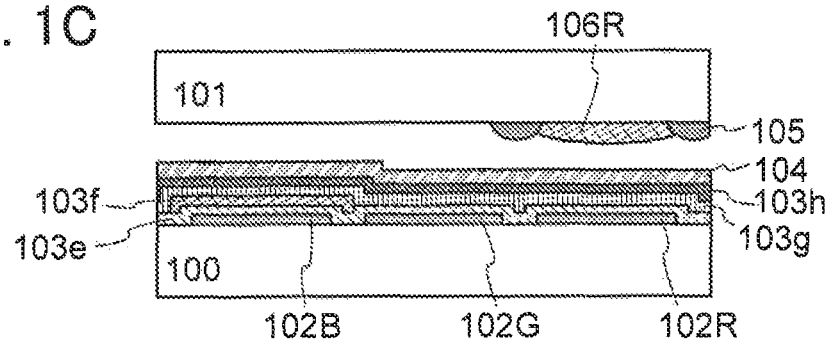

FIG. 1C shows a light-emitting device of one embodiment of the present invention using a single element of blue fluorescence and a single element of green phosphorescence. As with the light-emitting device shown in FIG. 1A, the light-emitting device includes at least a first light-emitting element, a second light-emitting element, and a third light-emitting element. A substrate 100, a sealing substrate 101, first electrodes 102B, 102G, and 102R, a second electrode 104, a black matrix 105, and a color conversion layer 106R are also similar to those of the light-emitting device shown in FIG. 1A; therefore, the description is omitted here.

In the light-emitting device shown in FIG. 1C, the first light-emitting element includes an EL layer with a first structure, and the second light-emitting element and the third light-emitting element include an EL layer with a second structure.

The EL layer with the first structure is a stack including a first EL layer 103e, a second EL layer 103f, a third EL layer 103g, and a fourth EL layer 103h. The EL layer with the second structure is a stack including the first EL layer 103e, the third EL layer 103g, and the fourth EL layer 103h.

In the case where the first electrodes are anodes and the second electrode is a cathode, the first EL layer 103e corresponds to a hole-injection layer 114 and a hole-transport layer 115 in FIG. 5B, the second EL layer 103f corresponds to the first light-emitting layer 116d-1 in FIG. 5B, the third EL layer 103g corresponds to the second light-emitting layer 116d-2 in FIG. 5B, and the fourth EL layer 103h corresponds to an electron-transport layer 117 and an electron-injection layer 118 in FIG. 5B. That is, the EL layer with the first structure has a structure similar to that of the EL layer 103*d* in FIG. 5B, and the EL layer with the second structure has a structure similar to that of an EL layer 103*a* in FIG. 5C.

Formation of the EL layer with the first structure and the EL layer with the second structure requires only one selective deposition step that uses a mask. That is, only one selective deposition step that uses a mask leads to much higher efficiency of light emission than that of a usual light-emitting element with a single structure in which a fluorescent layer and a phosphorescent layer are stacked.

The second EL layer 103*f* contains an organic compound that emits blue fluorescence as a light-emitting material, and the third EL layer 103*g* contains an organic compound that emits green phosphorescence as a light-emitting material. The second EL layer 103*f* and the third EL layer 103*g* each contain a first organic compound as a host material, in addition to their respective light-emitting materials. Furthermore, the second EL layer 103*f* and the third EL layer 103*g* each contain a second organic compound as well, and it is preferable that the first organic compound and the second organic compound form an exciplex and energy transfer occur from the exciplex to the light-emitting materials. In addition, the emission spectrum of the exciplex and the absorption band of the light-emitting material on the longest wavelength side preferably overlap with each other, which enables energy transfer with favorable efficiency.

In the light-emitting device with this structure, it is preferable that the second EL layer 103*f* and the third EL layer 103*g* be each a layer in which the electron-transport property is higher than the hole-transport property. With such a structure, only blue fluorescence can be obtained from the first light-emitting element, and only green phosphorescence can be obtained from the second light-emitting element and the third light-emitting element. Note that in the case where the first electrodes are cathodes and the second electrode is an anode, the first EL layer 103*e* corresponds to the electron-transport layer 117 and the electron-injection layer 118 in FIG. 5B, the fourth EL layer 103*h* corresponds to the hole-injection layer 114 and the hole-transport layer 115 in FIG. 5B, and it is preferable that the second EL layer 103*f* and the third EL layer 103*g* be each a layer in which the hole-transport property is higher than the electron-transport property.

Although the second EL layer 103*f* in FIG. 1C is formed before the third EL layer 103*g* is formed, the third EL layer 103*g* may be formed before the second EL layer 103*f* is formed. In that case, it is preferable that the second EL layer 103*f* and the third EL layer 103*g* be each a layer in which the hole-transport property is higher than the electron-transport property. In the case where the first electrode is a cathode and the second electrode is an anode, it is preferable that the second EL layer 103*f* and the third EL layer 103*g* be each a layer in which the electron-transport property is higher than the hole-transport property.

When light emitted from the third light-emitting element enters the color conversion layer 106R, red light can be obtained from the color conversion layer 106R. Note that light emitted from the first light-emitting element and light emitted from the second light-emitting element may be extracted outside the light-emitting device through color filters. Without color filters, light can be obtained with high efficiency. Emitted through color filters, light can be obtained with high color purity.

Here, the external quantum efficiency of each pixel in the light-emitting device having the above structure and the external quantum efficiency of each pixel in a light-emitting device having a structure different from the above will be considered. Note that the carrier balance, exciton generation probability, and the like in light-emitting elements used in the light-emitting devices are assumed to be similar.

First, the external quantum efficiency of each pixel in the light-emitting device having a structure without a color conversion layer, which is different from the above, will be calculated. The structures of the light-emitting elements in the light-emitting device are similar to the structures of the light-emitting elements in the light-emitting device shown in FIG. 1C. In order to efficiently obtain red, green, and blue colors with the light-emitting device, in general, light-emitting materials that emit light having intensity at the wavelengths corresponding to the colors are required. In the case where a blue fluorescent material, a red phosphorescent material, and a green phosphorescent material are used in view of practicality and efficiency, the blue fluorescent material is used for the second EL layer 103*f*, and the red phosphorescent material and the green phosphorescent material are used for the third EL layer 103*g*. Light in which red light and green light are synthesized is obtained from the second light-emitting element and the third light-emitting element. Therefore, light from the second light-emitting element is extracted outside the light-emitting device through a green color filter, whereby green light emission can be obtained, and light from the third light-emitting element is extracted outside the light-emitting device through a red color filter, whereby red light emission can be obtained.

In the light-emitting element having such a structure, the internal quantum efficiency of the fluorescent layer and that of the phosphorescent layer are assumed to be 25% and 100%, respectively. Then, the external quantum efficiency of a blue pixel is $25 \times \chi_A$ % (when a color filter is not used; it is $25 \times \chi_{CF}$ % when a color filter is used), and the external quantum efficiency of a green pixel and that of a red pixel are each $50 \times \chi_{CF}$ %.

Next, for the light-emitting device having the structure shown in FIG. 1C, the external quantum efficiency of a blue pixel is $25 \times \chi_A$ % (when a color filter is not used; it is $25 \times \chi_{CF}$ % when a color filter is used), the external quantum efficiency of a green pixel is $100 \times \chi_A$ % (when a color filter is not used; it is $100 \times \chi_{CF}$ % when a color filter is used), and the external quantum efficiency of a red pixel is $100 \times \chi_{CC}$ %. In this way, the use of the structure of one embodiment of the present invention can provide a light-emitting device with very high light emission efficiency.

Here, the external quantum efficiency of the green pixel with the structure of this embodiment is $100 \times \chi_A$ %, whereas that with the conventional structure is $50 \times \chi_{CF}$ %, which means that the external quantum efficiency of the green pixel with the structure of this embodiment is expected to be twice or more that with the conventional structure. Furthermore, the external quantum efficiency of the red pixel with the structure of this embodiment is $100 \times \chi_{CC}$ %, whereas that with the conventional structure is $50 \times \chi_{CF}$ %, which means that the external quantum efficiency of the red pixel with the structure of this embodiment is expected to be twice that with the conventional structure, in the case where the transmittance of the color filter and the PL quantum yield of the color conversion layer are the same. Accordingly, as long as the PL quantum yield of the color conversion layer is greater than or equal to 50% of the transmittance of the color filter, a red pixel with the external quantum efficiency higher than that of the conventional red pixel can be obtained, and power consumption of the light-emitting device can be reduced.

Figure 2C:
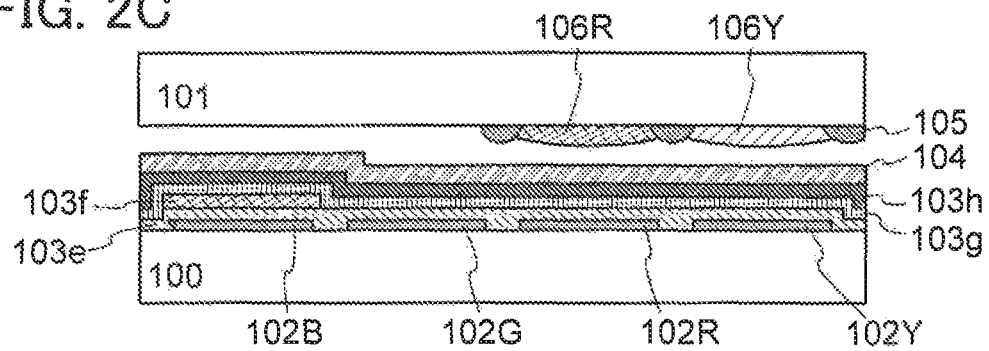

As shown in FIG. 2C, a fourth light-emitting element that constitutes a yellow pixel may be added to the structure shown in FIG. 1C. The fourth light-emitting element includes the EL layer with the second structure between a first electrode 102Y and the second electrode 104. Light emitted from the fourth light-emitting element enters a color conversion layer 106Y, and the color conversion layer 106Y emits yellow light. The external quantum efficiency of the yellow pixel is 100×$\chi_{CC}$ % because the yellow light is obtained by color-converting green phosphorescence.

The light-emitting device having such a structure can express an image with four colors, i.e., red, green, blue, and yellow, and is excellent in color reproducibility. In addition, since yellow light has a high luminosity factor, power consumption can be reduced.

<Conversion from Single Element of Blue Fluorescence and Single Element of Green Phosphorescence (One Selective Deposition Step Using Mask) 2>

Figure 1D:
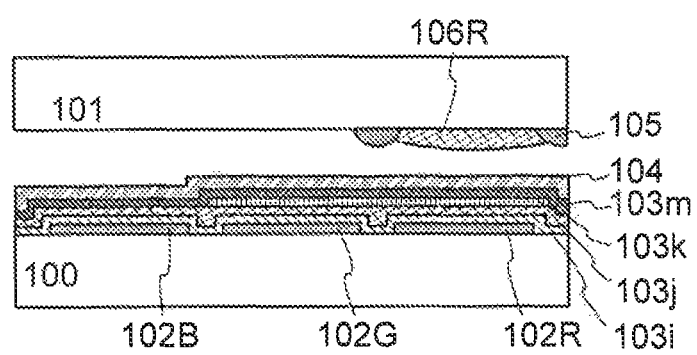

FIG. 1D shows a light-emitting device of one embodiment of the present invention using a single element of blue fluorescence and a single element of green phosphorescence. As with the light-emitting device shown in FIG. 1A, the light-emitting device includes at least a first light-emitting element, a second light-emitting element, and a third light-emitting element. A substrate 100, a sealing substrate 101, first electrodes 102B, 102G, and 102R, a second electrode 104, a black matrix 105, and a color conversion layer 106R are also similar to those of the light-emitting device shown in FIG. 1A; therefore, the description is omitted here.

In the light-emitting device shown in FIG. 1D, the first light-emitting element includes an EL layer with a third structure, and the second light-emitting element and the third light-emitting element include an EL layer with a fourth structure.

The EL layer with the third structure is a stack including a first EL layer 103$i$, a second EL layer 103$j$, and a fourth EL layer 103$m$. The EL layer with the fourth structure is a stack including the first EL layer 103$i$, the second EL layer 103$j$, a third EL layer 103$k$, and the fourth EL layer 103$m$.

In the case where the first electrodes are anodes and the second electrode is a cathode, the first EL layer 103$i$ corresponds to the hole-injection layer 114 and the hole-transport layer 115 in FIG. 5B, the second EL layer 103$j$ corresponds to the first light-emitting layer 116$d$-1 in FIG. 5B, the third EL layer 103$k$ corresponds to the second light-emitting layer 116$d$-2 in FIG. 5B, and the fourth EL layer 103$m$ corresponds to the electron-transport layer 117 and the electron-injection layer 118 in FIG. 5B. That is, the EL layer with the fourth structure has a structure similar to that of the EL layer 103$d$ in FIG. 5B, and the EL layer with the third structure has a structure similar to that of the EL layer 103$a$ in FIG. 5C.

Formation of the EL layer with the third structure and the EL layer with the fourth structure requires only one selective deposition step that uses a mask. That is, only one selective deposition step that uses a mask leads to much higher efficiency of light emission than that of a usual light-emitting element with a single structure in which a fluorescent layer and a phosphorescent layer are stacked.

The second EL layer 103$j$ contains an organic compound that emits blue fluorescence as a light-emitting material, and the third EL layer 103$k$ contains an organic compound that emits green phosphorescence as a light-emitting material. The second EL layer 103$j$ and the third EL layer 103$k$ each contain a first organic compound as a host material, in addition to the light-emitting material. Furthermore, the second EL layer 103$j$ and the third EL layer 103$k$ each contain a second organic compound as well, and it is preferable that the first organic compound and the second organic compound form an exciplex and energy transfer occur from the exciplex to the light-emitting material. In addition, the emission spectrum of the exciplex and the absorption band of the light-emitting material on the longest wavelength side preferably overlap with each other, which enables energy transfer with favorable efficiency.

In the light-emitting device with this structure, it is preferable that the second EL layer 103$j$ and the third EL layer 103$k$ be each a layer in which the hole-transport property is higher than the electron-transport property. With such a structure, only blue fluorescence can be obtained from the first light-emitting element, and only green phosphorescence can be obtained from the second light-emitting element and the third light-emitting element. Note that in the case where the first electrodes are cathodes and the second electrode is an anode, the first EL layer 103$i$ corresponds to the electron-transport layer 117 and the electron-injection layer 118 in FIG. 5B, the fourth EL layer 103$m$ corresponds to the hole-injection layer 114 and the hole-transport layer 115 in FIG. 5B, and it is preferable that the second EL layer 103$j$ and the third EL layer 103$k$ be each a layer in which the electron-transport property is higher than the hole-transport property.

Although the second EL layer 103$j$ in FIG. 1D is formed before the third EL layer 103$k$ is formed, the third EL layer 103$k$ may be formed before the second EL layer 103$j$ is formed. In that case, it is preferable that the second EL layer 103$j$ and the third EL layer 103$k$ be each a layer in which the hole-transport property is higher than the electron-transport property. In the case where the first electrode is a cathode and the second electrode is an anode, it is preferable that the second EL layer 103$j$ and the third EL layer 103$k$ be each a layer in which the electron-transport property is higher than the hole-transport property.

When light emitted from the third light-emitting element enters the color conversion layer 106R, red light can be obtained from the color conversion layer 106R. Note that light emitted from the first light-emitting element and light emitted from the second light-emitting element may be extracted outside the light-emitting device through color filters. Without color filters, light can be obtained with high efficiency. Emitted through color filters, light can be obtained with high color purity.

Here, the external quantum efficiency of each pixel in the light-emitting device having the above structure and the external quantum efficiency of each pixel in a light-emitting device having a structure different from the above will be considered. Note that the carrier balance, exciton generation probability, and the like in light-emitting elements used in the light-emitting devices are assumed to be similar.

First, the external quantum efficiency of each pixel in the light-emitting device having a structure without a color conversion layer, which is different from the above, will be calculated. The structures of the light-emitting elements in the light-emitting device are similar to the structures of the light-emitting elements in the light-emitting device shown in FIG. 1D. In order to efficiently obtain red, green, and blue colors with the light-emitting device, in general, light-emitting materials that emit light having intensity at the wavelengths corresponding to the colors are required. In the case where a blue fluorescent material, a red phosphorescent material, and a green phosphorescent material are used in view of practicality and efficiency, it is preferable that the blue fluorescent material be used for the second EL layer 103$j$, and the red phosphorescent material and the green phosphorescent material be used for the third EL layer 103*k*. Light in which red light and green light are synthesized is obtained from the second light-emitting element and the third light-emitting element. Therefore, light from the second light-emitting element is extracted outside the light-emitting device through a green color filter, whereby green light emission can be obtained, and light from the third light-emitting element is extracted outside the light-emitting device through a red color filter, whereby red light emission can be obtained.

In the light-emitting element having such a structure, the internal quantum efficiency of the fluorescent layer and that of the phosphorescent layer are assumed to be 25% and 100%, respectively. Then, the external quantum efficiency of a blue pixel is $25 \times \chi_A$ % (when a color filter is not used; it is $25 \times \chi_{CF}$ % when a color filter is used), and the external quantum efficiency of a green pixel and that of a red pixel are each $50 \times \chi_{CF}$ %.

Next, for the light-emitting device having the structure shown in FIG. 1D, the external quantum efficiency of a blue pixel is $25 \times \chi_A$ % (when a color filter is not used; it is $25 \times \chi_{CF}$ % when a color filter is used), the external quantum efficiency of a green pixel is $100 \times \chi_A$ % (when a color filter is not used; it is $100 \times \chi_{CF}$ % when a color filter is used), and the external quantum efficiency of a red pixel is $100 \times \chi_{CC}$ %. In this way, the use of the structure of one embodiment of the present invention can provide a light-emitting device with very high light emission efficiency.

Here, the external quantum efficiency of the green pixel with the structure of this embodiment is $100 \times \chi_A$ %, whereas that with the conventional structure is $50 \times \chi_{CF}$ %, which means that the external quantum efficiency of the green pixel with the structure of this embodiment is expected to be twice or more that with the conventional structure. Furthermore, the external quantum efficiency of the red pixel with the structure of this embodiment is $100 \times \chi_{CC}$ %, whereas that with the conventional structure is $50 \times \chi_{CF}$ %, which means that the external quantum efficiency of the red pixel with the structure of this embodiment is expected to be twice that with the conventional structure, in the case where the transmittance of the color filter and the PL quantum yield of the color conversion layer are the same. Accordingly, as long as the PL quantum yield of the color conversion layer is greater than or equal to 50% of the transmittance of the color filter, a red pixel with the external quantum efficiency higher than that of the conventional red pixel can be obtained, and power consumption of the light-emitting device can be reduced.

Figure 2D:
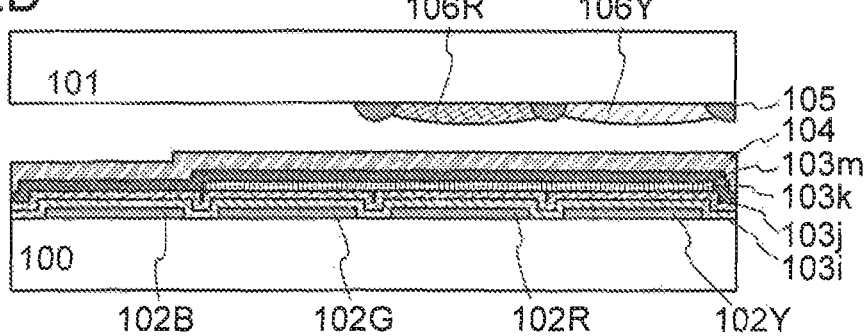

As shown in FIG. 2D, a fourth light-emitting element that constitutes a yellow pixel may be added to the structure shown in FIG. 1D. The fourth light-emitting element includes the EL layer with the fourth structure between a first electrode 102Y and the second electrode 104. Light emitted from the fourth light-emitting element enters a color conversion layer 106Y, and the color conversion layer 106Y emits yellow light. The external quantum efficiency of the yellow pixel is $100 \times \chi_{CC}$ % because the yellow light is obtained by color-converting green phosphorescence.

The light-emitting device having such a structure can express an image with four colors, i.e., red, green, blue, and yellow, and is excellent in color reproducibility. In addition, since yellow light has a high luminosity factor, power consumption can be reduced.

<Conversion from Tandem Element of Blue Fluorescence and Yellow Phosphorescence>

Figure 3A:
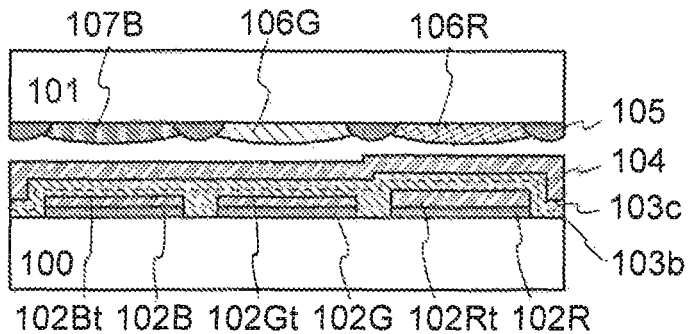
FIGS. 3A to 3D are conceptual diagrams of light-emitting devices.

FIG. 3A shows a light-emitting device of one embodiment of the present invention using a tandem element of blue fluorescence and yellow phosphorescence. The light-emitting device includes at least a first light-emitting element, a second light-emitting element, and a third light-emitting element provided over a substrate 100. The first to third light-emitting elements share an EL layer 103 and a second electrode 104, and each have a different first electrode. The first light-emitting element, the second light-emitting element, and the third light-emitting element have a first electrode 102B, a first electrode 102G, and a first electrode 102R, respectively. A sealing substrate 101 is provided with a black matrix 105, a color filter 107B, a color conversion layer 106G, and a color conversion layer 106R. The color filter 107B transmits blue light. The color conversion layer 106G contains a color conversion substance that emits green light, and the color conversion layer 106R contains a color conversion substance that emits red light.

In FIG. 3A, the EL layer 103 has a tandem structure, a typical example of which is shown in FIG. 5A. The tandem structure refers to a structure in which a first light-emitting unit 103*b* and a second light-emitting unit 103*c* are stacked with an intermediate layer 109 that is a charge generation layer positioned therebetween. Supposing a first electrode 102 is an anode and the second electrode 104 is a cathode, each light-emitting unit typically has a structure where a hole-injection layer 114, a hole-transport layer 115, a light-emitting layer 116, an electron-transport layer 117, an electron-injection layer 118, and the like are stacked in this order from the first electrode 102 (here, an anode) side. With such a structure, a light-emitting material is contained in the light-emitting layer 116. In the case where the first electrode 102 is the cathode and the second electrode 104 is the anode, the above-described order of stack in the EL layer is reversed. Note that the EL layer 103 is shared by the first to third light-emitting elements.

One of the first light-emitting unit 103*b* and the second light-emitting unit 103*c* emits blue fluorescence, and the other emits yellow phosphorescence. Light in which blue fluorescence and yellow phosphorescence are synthesized is obtained from the EL layer 103. The light-emitting layer included in each of the light-emitting unit contains a first organic compound as a host material, in addition to the light-emitting material. Furthermore, the light-emitting layer also contains a second organic compound, and it is preferable that the first organic compound and the second organic compound form an exciplex and energy transfer occur from the exciplex to the light-emitting material. In addition, the emission spectrum of the exciplex and the absorption band of the light-emitting material on the longest wavelength side preferably overlap with each other, which enables energy transfer with favorable efficiency.

Light emitted from the first light-emitting element is extracted outside the light-emitting device through the color filter 107B. Light emitted from the second light-emitting element enters the color conversion layer 106G, and the color conversion layer 106G is excited by the entering light and emits green light. Light emitted from the third light-emitting element enters the color conversion layer 106R, and the color conversion layer 106R emits red light.

Note that in this light-emitting device, light in which blue fluorescence and yellow phosphorescence are synthesized is emitted from the EL layer 103; however, the color conversion layer 106G cannot absorb yellow light. Thus, it is preferable that yellow light that enters the color conversion layer 106G be removed with the use of a resonant structure or a color filter. When the resonant structure is formed, it is formed such that blue light is amplified. The resonant structures can be provided by forming transparent conductive films (i.e., a transparent conductive film 102Bt, a transparent conductive film 102Gt, and a transparent conductive film 102Rt) with desired thicknesses over the first electrodes, as shown in FIG. 3A. Note that the resonant structures need not be formed in the first light-emitting element and the third light-emitting element for the purpose of removing light that cannot be absorbed. In the case where the resonant structures are formed for the other purpose, the transparent conductive film 102Bt may be formed such that blue light is amplified in the first light-emitting element, and the transparent conductive film 102Rt may be formed such that yellow light is amplified in the third light-emitting element.

Here, the external quantum efficiency of each pixel in the light-emitting device having the above structure and the external quantum efficiency of each pixel in a light-emitting device having a structure different from the above will be considered. Note that the carrier balance, exciton generation probability, and the like in light-emitting elements used in the light-emitting devices are assumed to be similar.

First, the external quantum efficiency of each color pixel in the light-emitting device having a structure different from the above will be calculated. In order to efficiently obtain red, green, and blue colors with a light-emitting device using a tandem element, in general, the use of light-emitting materials having respective light emission wavelengths is effective. In view of the practicality and efficiency, a blue fluorescent material, a red phosphorescent material, and a green phosphorescent material are often used. A double tandem structure, which is the same as FIG. 5A, is employed. The light-emitting layer of one of the light-emitting units is a fluorescent layer using a blue fluorescent material, and the light-emitting layer of the other light-emitting unit is a phosphorescent layer using a red phosphorescent material and a green phosphorescent material.

In the light-emitting element having such a structure, the internal quantum efficiency of the fluorescent layer and that of the phosphorescent layer are assumed to be 25% and 100%, respectively. Then, the external quantum efficiency of a blue pixel is $25 \times \chi_{CF}$ %, and the external quantum efficiency of a green pixel and that of a red pixel are each $50 \times \chi_{CF}$ % (It is because excitons are divided between the red phosphorescent material and the green phosphorescent material in the phosphorescent layer. For simplicity, excitons are assumed to be divided half and half).

Next, the light-emitting device having the above structure (the structure shown in FIG. 3A) will be considered. The external quantum efficiency of the blue pixel, that of the green pixel, and that of the red pixel are $25 \times \chi_{CF}$ %, $25 \times \chi_{CC}$ %, and $125 \times \chi_{CC}$ % (in the case where a resonant structure is not formed; it is $100 \times \chi_{CC}$ % in the case where a resonant structure is formed, because blue light attenuates), respectively. In this way, the use of the light-emitting elements of one embodiment of the present invention can greatly increase the efficiency of red light emission.

Here, the external quantum efficiency of the red pixel with the structure of this embodiment is $125 \times \chi_{CC}$ %, whereas that with the conventional structure is $50 \times \chi_{CF}$ %, which means that the external quantum efficiency of the red pixel with the structure of this embodiment is expected to be 2.5 times that with the conventional structure, in the case where the transmittance of the color filter and the PL quantum yield of the color conversion layer are the same. Accordingly, as long as the PL quantum yield of the color conversion layer is greater than or equal to 40% of the transmittance of the color filter, a red pixel with the external quantum efficiency higher than that of the conventional red pixel can be obtained.

Figure 4A:
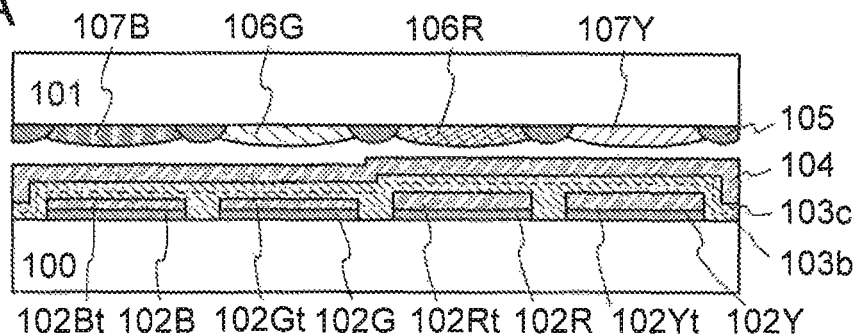
FIGS. 4A to 4D are conceptual diagrams of light-emitting devices.

As shown in FIG. 4A, a fourth light-emitting element as a yellow pixel may be added to the structure shown in FIG. 3A. The fourth light-emitting element includes the EL layer including the first light-emitting unit 103b and the second light-emitting unit 103c between a first electrode 102Y and the second electrode 104. A resonant structure corresponding to yellow light emission may be provided, in which case a transparent conductive film 102Yt may be formed. Since light emitted from the fourth light-emitting element is extracted outside the light-emitting device through a color filter 107Y, the external quantum efficiency of the yellow pixel is $100 \times \chi_{CF}$ %. The color filter 107Y may be replaced by a yellow color conversion layer 106Y, in which case the external quantum efficiency of the yellow pixel is $125 \times \chi_{CC}$ %.

The light-emitting device having such a structure can express an image with four colors, i.e., red, green, blue, and yellow, and is excellent in color reproducibility. In addition, since yellow light has a high luminosity factor, power consumption can be reduced.

Note that in the case where the structure shown in FIG. 4A is employed, white light can be expressed only with red, blue, and yellow light, and thus the efficiency of green light hardly affects the power consumption. Accordingly, in view of the efficiency of the yellow pixel being 100%, a light-emitting device with higher efficiency than that of a conventional light-emitting device can be obtained as long as the PL quantum yield of the color conversion layer 106R, which is a first color conversion layer provided in the red pixel, is higher than 40%. In the case where the resonant structure is formed, the light-emitting device can have higher efficiency than that of a conventional light-emitting device as long as the PL quantum yield of the color conversion layer 106R is higher than 50%.

<Conversion from Single Element of Blue Fluorescence and Yellow Phosphorescence>

Figure 3B:
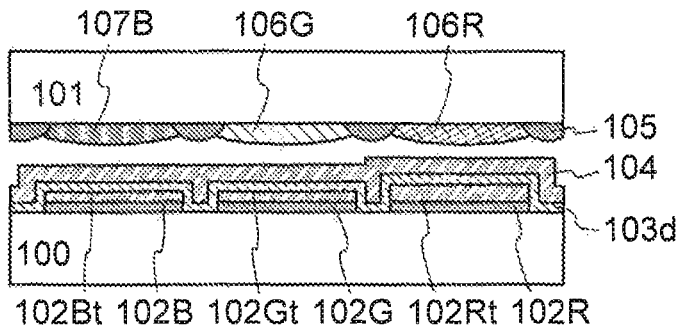

FIG. 3B shows a light-emitting device of one embodiment of the present invention using a single element utilizing blue fluorescence and yellow phosphorescence. As with the light-emitting device shown in FIG. 3A, the light-emitting device includes at least a first light-emitting element, a second light-emitting element, and a third light-emitting element. A substrate 100, a sealing substrate 101, first electrodes 102B, 102G, and 102R, a second electrode 104, a black matrix 105, a color conversion layer 106R, a color conversion layer 106G, and a color filter 107B are also similar to those of the light-emitting device shown in FIG. 3A; therefore, the description is omitted here.

In FIG. 3B, an EL layer 103d has a single structure, a typical example of which is shown in FIG. 5B. The first light-emitting layer 116d-1 and the second light-emitting layer 116d-2 may be formed in contact with each other, or a separation layer with a thickness of less than or equal to 20 nm may be provided therebetween. The thickness of the separation layer is preferably greater than or equal to 1 nm and less than or equal to 10 nm. Note that the EL layer 103d is shared by the first to third light-emitting elements.

In this structure, one of the first light-emitting layer 116d-1 and the second light-emitting layer 116d-2 in FIG. 5B emits blue fluorescence, and the other emits yellow phosphorescence. Light in which blue fluorescence and yellow phosphorescence are synthesized is obtained from the EL layer 103d. The first light-emitting layer 116d-1 and the second light-emitting layer 116d-2 each contain a first organic compound as a host material, in addition to a light-emitting material. Furthermore, the first light-emitting layer 116d-1 and the second light-emitting layer 116d-2 each contain a second organic compound as well, and it is preferable that the first organic compound and the second organic compound form an exciplex and energy transfer occur from the exciplex to the light-emitting materials. In addition, the emission spectrum of the exciplex and the absorption band of the light-emitting material on the longest wavelength side preferably overlap with each other, which enables energy transfer with favorable efficiency.

Light emitted from the first light-emitting element is extracted outside the light-emitting device through the blue color filter 107B. Light emitted from the second light-emitting element enters the color conversion layer 106G, and the color conversion layer 106G is excited by the entering light and emits green light. Similarly, light emitted from the third light-emitting element enters the color conversion layer 106R, and the color conversion layer 106R emits red light.

Note that in this light-emitting device, light in which blue fluorescence and yellow phosphorescence are synthesized is emitted from the EL layer 103, As with FIG. 3A; however, the color conversion layer 106G cannot absorb yellow light. Thus, it is preferable that yellow light that enters the color conversion layer 106G be removed with the use of a resonant structure or a color filter. When the resonant structure is formed, it is formed such that blue light is amplified. The resonant structures can be provided by forming transparent conductive films (a transparent conductive film 102Bt, a transparent conductive film 102Gt, and a transparent conductive film 102Rt) with desired thicknesses over the first electrodes, as shown in FIG. 3B. Note that the resonant structures need not be formed in the first light-emitting element and the third light-emitting element for the purpose of removing light that cannot be absorbed. In the case where the resonant structures are formed for the other purpose, the transparent conductive film 102Bt may be formed such that blue light is amplified in the first light-emitting element, and the transparent conductive film 102Rt may be formed such that yellow light is amplified in the third light-emitting element.

Here, the external quantum efficiency of each pixel in the light-emitting device having the above structure and the external quantum efficiency of each pixel in a light-emitting device having a structure different from the above will be considered. Note that the carrier balance, exciton generation probability, and the like in light-emitting elements used in the light-emitting devices are assumed to be similar.

First, the external quantum efficiency of each pixel in the light-emitting device having a structure different from the above will be calculated. The light-emitting elements have a single-structure EL layer in which two light-emitting layers are adjacent to each other in one light-emitting unit as shown in FIG. 5B. In order to obtain red, green, and blue colors with the light-emitting elements having such a structure, without the use of a color conversion layer, the use of light-emitting materials having respective light emission wavelengths is effective. In view of practicality and efficiency, a blue fluorescent material, a red phosphorescent material, and a green phosphorescent material are often used. When one of the first light-emitting layer 116d-1 and the second light-emitting layer 116d-2 is a fluorescent layer and the other is a phosphorescent layer, the blue fluorescent material is contained in one of the light-emitting layers, and the red phosphorescent material and the green phosphorescent material are contained in the other light-emitting layer. Assuming that the internal quantum efficiency of the fluorescent layer is 25% and that of the phosphorescent layer is 100%, and that excitons are divided equally between blue, green, and red (i.e., 1:1:1); the external quantum efficiency of a blue pixel is $8.3\times\chi_{CF}$ %, and that of a green pixel and that of a red pixel are each $33\times\chi_{CF}$ %.

Next, the light-emitting device having a structure shown in FIG. 3B will be considered. In addition to the assumption similar to the above, it is assumed that excitons are divided between blue and yellow half and half (1:1) and that the PL quantum yield of color conversion layers is 100%; thus, the external quantum efficiency of a blue pixel, that of a green pixel, and that of a red pixel are $12.5\times\chi_{CF}$ %, $12.5\times\chi_{CC}$ %, and $62.5\times\chi_{CC}$ % (in the case where a resonant structure is not used; it is $50\times\chi_{CC}$ % in the case where a resonant structure is used, because blue light attenuates), respectively. In this way, the use of the light-emitting elements of one embodiment of the present invention can greatly increase the external quantum efficiency of the red pixel.

Figure 4B:
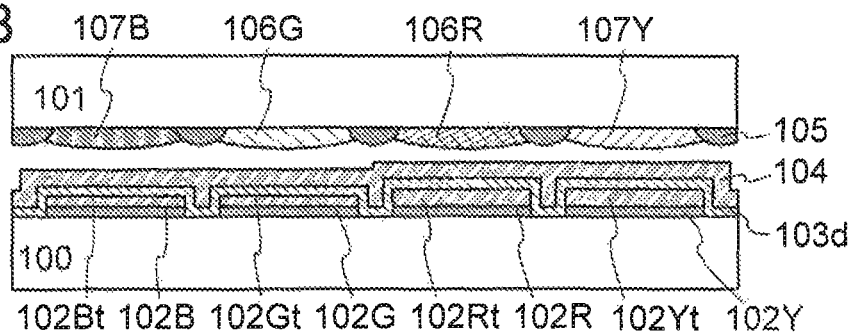

Here, the external quantum efficiency of the blue pixel with the structure of this embodiment is $12.5\times\chi_{CF}$ %, whereas that with the conventional structure is $8.3\times\chi_{CF}$ %, which means that the external quantum efficiency of the blue pixel with the structure of this embodiment is expected to be approximately 1.5 times that with the conventional structure. Furthermore, the external quantum efficiency of the red pixel with the structure of this embodiment is $62.5\times\chi_{CC}$ %, whereas that with the conventional structure is $33\times\chi_{CF}$ %, which means that the external quantum efficiency of the red pixel with the structure of this embodiment is expected to be approximately 1.88 times that with the conventional structure, in the case where the transmittance of the color filter and the PL quantum yield of the color conversion layer are the same. Accordingly, as long as the PL quantum yield of the color conversion layer in the red pixel is greater than or equal to 53.3% of the transmittance of the color filter, a red pixel with the external quantum efficiency higher than that of the conventional red pixel can be obtained As shown in FIG. 4B, a fourth light-emitting element that constitutes a yellow pixel may be added to the structure shown in FIG. 3B. The fourth light-emitting element includes the EL layer 103d between a first electrode 102Y and the second electrode 104. Light emitted from the fourth light-emitting element is extracted outside the light-emitting device through a color filter 107Y, so that the external quantum efficiency of the yellow pixel is $50\times\chi_{CF}$ %. When a resonant structure is formed, it is formed such that yellow light is amplified. The resonant structure can be provided by forming a transparent conductive film 102Yt with a desired thickness over the first electrode, as shown in FIG. 4B. Furthermore, the color filter 107Y may be replaced by a yellow color conversion layer 106Y, in which case the external quantum efficiency of the yellow pixel is $62.5\times\chi_{CC}$ %.

The light-emitting device having such a structure can express an image with four colors, i.e., red, green, blue, and yellow, and is excellent in color reproducibility. In addition, since yellow light has a high luminosity factor, power consumption can be reduced.

Note that in the case where the structure shown in FIG. 4B is employed, white light can be expressed only with red, blue, and yellow light, and thus the efficiency of green light hardly affects the power consumption. Accordingly, in view of the external quantum efficiency of the yellow pixel being $50\times\chi_{CF}$ %, a light-emitting device with higher efficiency than that of a conventional light-emitting device can be obtained as long as the PL quantum yield of the color conversion layer 106R, which is a first color conversion layer provided in the red pixel, is greater than 53.3% of the transmittance (%) of the red color filter. In the case where the resonant structure is formed, the light-emitting device can have a higher efficiency than that of a conventional light-emitting device as long as the PL quantum yield of the color conversion layer 106R is greater than 66% of the transmittance (%) of the red color filter.

<Conversion from Single Element of Blue Fluorescence and Single Element of Yellow Phosphorescence (One Selective Deposition Step Using Mask) 1>

Figure 3C:
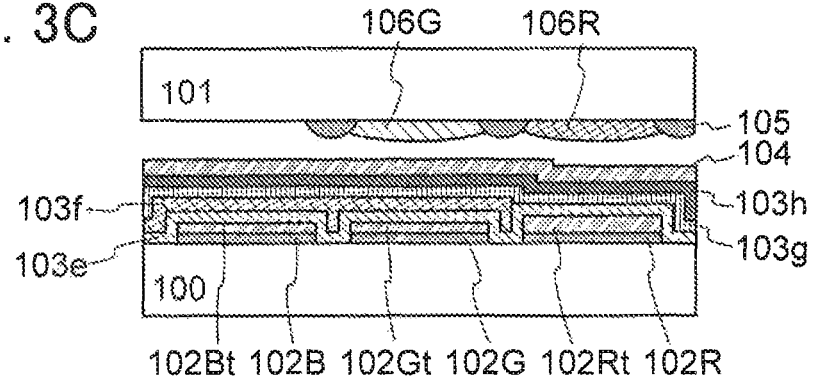

FIG. 3C shows a light-emitting device of one embodiment of the present invention using a single element of blue fluorescence and a single element of yellow phosphorescence. As with the light-emitting device shown in FIG. 3A, the light-emitting device includes at least a first light-emitting element, a second light-emitting element, and a third light-emitting element. A substrate 100, a sealing substrate 101, first electrodes 102B, 102G, and 102R, a second electrode 104, a black matrix 105, and color conversion layers 106G and 106R are also similar to those of the light-emitting device shown in FIG. 3A; therefore, the description is omitted here.

In the light-emitting device shown in FIG. 3C, the first light-emitting element and the second light-emitting element include an EL layer with a fifth structure, and the third light-emitting element includes an EL layer with a sixth structure.

The EL layer with the fifth structure is a stack including a first EL layer 103e, a second EL layer 103f, a third EL layer 103g, and a fourth EL layer 103h. The EL layer with the sixth structure is a stack including the first EL layer 103e, the third EL layer 103g, and the fourth EL layer 103h.

In the case where the first electrodes are anodes and the second electrode is a cathode, the first EL layer 103e corresponds to the hole-injection layer 114 and the hole-transport layer 115 in FIG. 5B, the second EL layer 103f corresponds to the first light-emitting layer 116d-1 in FIG. 5B, the third EL layer 103g corresponds to the second light-emitting layer 116d-2 in FIG. 5B, and the fourth EL layer 103h corresponds to the electron-transport layer 117 and the electron-injection layer 118 in FIG. 5B. That is, the EL layer with the fifth structure has a structure similar to that of the EL layer 103d in FIG. 5B, and the EL layer with the sixth structure has a structure similar to that of the EL layer 103a in FIG. 5C.

The second EL layer 103f contains an organic compound that emits blue fluorescence as a light-emitting material, and the third EL layer 103g contains an organic compound that emits yellow phosphorescence as a light-emitting material. The second EL layer 103f and the third EL layer 103g each contain a first organic compound as a host material, in addition to their respective light-emitting materials. Furthermore, the second EL layer 103f and the third EL layer 103g each contain a second organic compound as well, and it is preferable that the first organic compound and the second organic compound form an exciplex and energy transfer occur from the exciplex to the light-emitting materials. In addition, the emission spectrum of the exciplex and the absorption band of the light-emitting material on the longest wavelength side preferably overlap with each other, which enables energy transfer with favorable efficiency.

In the light-emitting device with this structure, it is preferable that the second EL layer 103f and the third EL layer 103g be each a layer in which the electron-transport property is higher than the hole-transport property. With such a structure, only blue fluorescence can be obtained from the first light-emitting element and the second light-emitting element, and only yellow phosphorescence can be obtained from the third light-emitting element. Note that in the case where the first electrodes are cathodes and the second electrode is an anode, the first EL layer 103e corresponds to the electron-transport layer 117 and the electron-injection layer 118 in FIG. 5B, the fourth EL layer 103h corresponds to the hole-injection layer 114 and the hole-transport layer 115 in FIG. 5B, and it is preferable that the second EL layer 103f and the third EL layer 103g be each a layer in which the hole-transport property is higher than the electron-transport property because of the reason similar to the above.

Although the second EL layer 103f in FIG. 3C is formed before the third EL layer 103g is formed, the third EL layer 103g may be formed before the second EL layer 103f is formed. In that case, it is preferable that the second EL layer 103f and the third EL layer 103g be each a layer in which the hole-transport property is higher than the electron-transport property. In the case where the first electrode is the cathode and the second electrode is the anode, it is preferable that the second EL layer 103f and the third EL layer 103g be each a layer in which the electron-transport property is higher than the hole-transport property.

Blue light can be obtained from the first light-emitting element. When light emitted from the second light-emitting element enters the color conversion layer 106G, green light can be obtained from the color conversion layer 106G. When light emitted from the third light-emitting element enters the color conversion layer 106R, red light can be obtained from the color conversion layer 106R. Note that light emitted from the first light-emitting element may be extracted outside the light-emitting device through a color filter. Without a color filter, light can be obtained with high efficiency. Emitted through a color filter, light can be obtained with high color purity.

Here, the external quantum efficiency of each pixel in the light-emitting device having the above structure and the external quantum efficiency of each pixel in a light-emitting device having a structure different from the above will be considered. Note that the carrier balance, exciton generation probability, and the like in light-emitting elements used in the light-emitting devices are assumed to be similar.

First, the external quantum efficiency of each pixel in the light-emitting device having a structure different from the above will be calculated. The structures of the first and third light-emitting elements in the light-emitting device are similar to the structures of the light-emitting elements in the light-emitting device shown in FIG. 3C. Although the second light-emitting element in FIG. 3C has the EL layer with the fifth structure, the second light-emitting element in this light-emitting device has the EL layer with the sixth structure.

In order to efficiently obtain red, green, and blue colors with the light-emitting elements having such structures, in general, the use of light-emitting materials that emit light having intensity at the wavelengths corresponding to the colors is effective. In view of practicality and efficiency, a blue fluorescent material, a red phosphorescent material, and a green phosphorescent material are often used. It is preferable that the blue fluorescent material be used for the second EL layer 103f, and the red phosphorescent material and the green phosphorescent material be used for the third EL layer 103g. With such a structure, light in which red light and green light are synthesized is obtained from the second light-emitting element and the third light-emitting element. In the second pixel, light is extracted outside the light-emitting device through a green color filter, whereby green light emission can be obtained. In the third pixel, light is extracted outside the light-emitting device through a red color filter, whereby red light emission can be obtained.

Here, supposing that excitons are divided between the red phosphorescent material and the green phosphorescent material half and half (1:1) in the third EL layer, the external quantum efficiency of the blue pixel is $25 \times \chi_A$ % (in the case where a color filter is not used; it is $25 \times \chi_{CF}$ % in the case where a color filter is used), and the external quantum efficiency of the green pixel and that of the red pixel are each $50 \times \chi_{CF}$ % (with color filters).

Next, the light-emitting device having the structure shown in FIG. 3C will be considered. The external quantum efficiency of the blue pixel is $25 \times \chi_A$ % (in the case where a color filter is not used; it is $25 \times \chi_{CF}$ % in the case where a color filter is used), the external quantum efficiency of the green pixel is $25 \times \chi_{CC}$ %, and the external quantum efficiency of the red pixel is $100 \times \chi_{CC}$ %. In this way, the use of the structure of one embodiment of the present invention can provide a light-emitting device with the external quantum efficiency of the red pixel higher than the external quantum efficiency of the red pixel in the conventional light-emitting device.

Here, the external quantum efficiency of the red pixel with the structure of this embodiment is $100 \times \chi_{CC}$ %, whereas that with the conventional structure is $50 \times \chi_{CF}$ %, which means that the external quantum efficiency of the red pixel with the structure of this embodiment is expected to be twice that with the conventional structure, in the case where the transmittance of the color filter and the PL quantum yield of the color conversion layer are the same. Accordingly, as long as the PL quantum yield of the color conversion layer is greater than or equal to 50% of the transmittance of the color filter, a red pixel with the external quantum efficiency higher than that of the conventional red pixel can be obtained, and power consumption of the light-emitting device can be reduced.

Figure 4C:
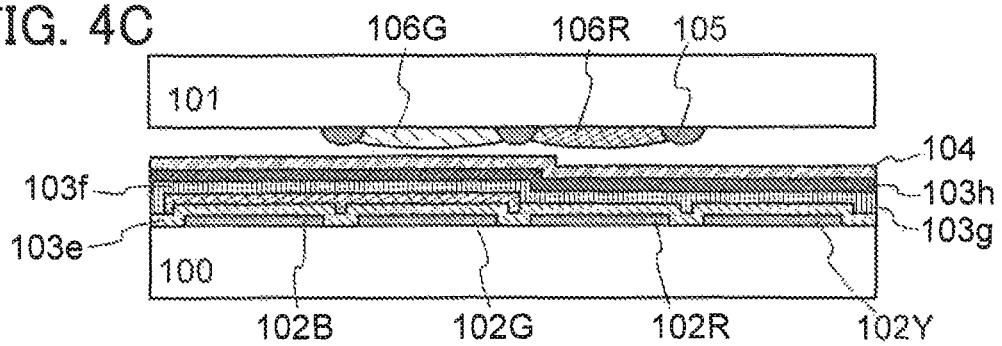

As shown in FIG. 4C, a fourth light-emitting element that constitutes a yellow pixel may be added to the structure shown in FIG. 3C. The fourth light-emitting element includes the EL layer with the sixth structure between a first electrode 102Y and the second electrode 104. The external quantum efficiency of the yellow pixel is $100 \times \chi_{CF}$ % in the case where light emitted from the fourth light-emitting element is extracted outside the light-emitting device through a color filter 107Y, or $100 \times \chi_A$ % in the case where a color filter is not provided.

The light-emitting device having such a structure can express an image with four colors, i.e., red, green, blue, and yellow, and is excellent in color reproducibility. In addition, since yellow light has a high luminosity factor, power consumption can be reduced.

Note that in the case where the structure shown in FIG. 4C is employed, white light can be expressed only with red, blue, and yellow light, and thus the efficiency of green light hardly affects the power consumption. Accordingly, even when the efficiency of the green pixel is reduced, red light emission is comparable to that of a conventional light-emitting element and a highly efficient light-emitting device can be obtained as long as the PL quantum yield of the color conversion layer 106R, which is a first color conversion layer provided in the red pixel, is greater than or equal to 50% of the transmittance of a red color filter.

Only one selective deposition step that uses a mask can bring these effects to the light-emitting device with the structure of this embodiment.

<Conversion from Single Element of Blue Fluorescence and Single Element of Yellow Phosphorescence (One Selective Deposition Step Using Mask) 2>

Figure 3D:
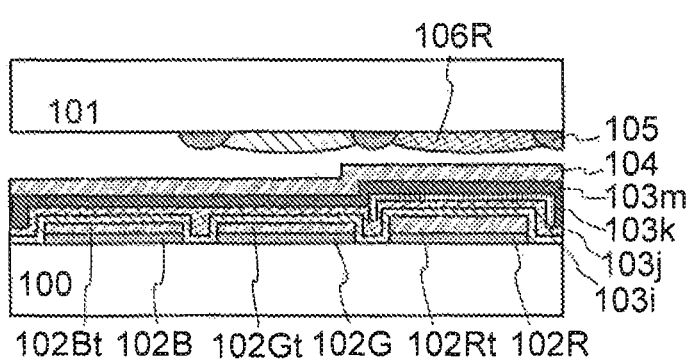

FIG. 3D shows a light-emitting device of one embodiment of the present invention using a single element of blue fluorescence and a single element of yellow phosphorescence. As with the light-emitting device shown in FIG. 3A, the light-emitting device includes at least a first light-emitting element, a second light-emitting element, and a third light-emitting element. A substrate 100, a sealing substrate 101, first electrodes 102B, 102G, and 102R, a second electrode 104, a black matrix 105, a color conversion layer 106G, and a color conversion layer 106R are also similar to those of the light-emitting device shown in FIG. 3A; therefore, the description is omitted here.

In the light-emitting device shown in FIG. 3D, the first light-emitting element and the second light-emitting element include an EL layer with a seventh structure, and the third light-emitting element includes an EL layer with an eighth structure.

The EL layer with the seventh structure is a stack including a first EL layer 103$i$, a second EL layer 103$j$, and a fourth EL layer 103$m$. The EL layer with the eighth structure is a stack including the first EL layer 103$i$, the second EL layer 103$j$, a third EL layer 103$k$, and the fourth EL layer 103$m$.

In the case where the first electrodes are anodes and the second electrode is a cathode, the first EL layer 103$i$ corresponds to the hole-injection layer 114 and the hole-transport layer 115 in FIG. 5B, the second EL layer 103$j$ corresponds to the first light-emitting layer 116$d$-1 in FIG. 5B, the third EL layer 103$k$ corresponds to the second light-emitting layer 116$d$-2 in FIG. 5B, and the fourth EL layer 103$m$ corresponds to the electron-transport layer 117 and the electron-injection layer 118 in FIG. 5B. That is, the EL layer with the seventh structure has a structure similar to that of the EL layer 103$a$ in FIG. 5C, and the EL layer with the eighth structure has a structure similar to that of the EL layer 103$d$ in FIG. 5B.

The second EL layer 103$j$ contains an organic compound that emits blue fluorescence as a light-emitting material, and the third EL layer 103$k$ contains an organic compound that emits yellow phosphorescence as a light-emitting material. The second EL layer 103$j$ and the third EL layer 103$k$ each contain a first organic compound as a host material, in addition to the light-emitting material. Furthermore, the second EL layer 103$j$ and the third EL layer 103$k$ each contain a second organic compound as well, and it is preferable that the first organic compound and the second organic compound form an exciplex and energy transfer occur from the exciplex to the light-emitting material. In addition, the emission spectrum of the exciplex and the absorption band of the light-emitting material on the longest wavelength side preferably overlap with each other, which enables energy transfer with favorable efficiency.

In the light-emitting device with this structure, it is preferable that the second EL layer 103$j$ and the third EL layer 103$k$ be each a layer in which the hole-transport property is higher than the electron-transport property. With such a structure, only blue fluorescence can be obtained from the first light-emitting element and the second light-emitting element, and only yellow phosphorescence can be obtained from the third light-emitting element. Note that in the case where the first electrodes are cathodes and the second electrode is an anode, the first EL layer 103$i$ corresponds to the electron-transport layer 117 and the electron-injection layer 118 in FIG. 5B, the fourth EL layer 103$m$ corresponds to the hole-injection layer 114 and the hole-transport layer 115 in FIG. 5B, and it is preferable that the second EL layer 103*j* and the third EL layer 103*k* be each a layer in which the electron-transport property is higher than the hole-transport property because of the reason similar to the above.

Although the second EL layer 103*j* in FIG. 3D is formed before the third EL layer 103*k* is formed, the third EL layer 103*k* may be formed before the second EL layer 103*j* is formed. In that case, it is preferable that the second EL layer 103*j* and the third EL layer 103*k* be each a layer in which the hole-transport property is higher than the electron-transport property. In the case where the first electrode is the cathode and the second electrode is the anode, it is preferable that the second EL layer 103*j* and the third EL layer 103*k* be each a layer in which the electron-transport property is higher than the hole-transport property.

Blue light can be obtained from the first light-emitting element. When light emitted from the second light-emitting element enters the color conversion layer 106G, green light can be obtained from the color conversion layer 106G. When light emitted from the third light-emitting element enters the color conversion layer 106R, red light can be obtained from the color conversion layer 106R. Light emitted from the first light-emitting element may be extracted outside the light-emitting device through a color filter. Without a color filter, light can be obtained with high efficiency. Emitted through a color filter, light can be obtained with high color purity.

Here, the external quantum efficiency of each pixel in the light-emitting device having the above structure and the external quantum efficiency of each pixel in a light-emitting device having a structure different from the above will be considered. Note that the carrier balance, exciton generation probability, and the like in light-emitting elements used in the light-emitting devices are assumed to be similar.

First, the external quantum efficiency of each pixel in the light-emitting device having a structure different from the above will be calculated. The structures of the first and third light-emitting elements in the light-emitting device are similar to the structures of the light-emitting elements in the light-emitting device shown in FIG. 3D. Although the second light-emitting element in FIG. 3D has the EL layer with the seventh structure, the second light-emitting element in this light-emitting device has the EL layer with the eighth structure.

In order to efficiently obtain red, green, and blue colors with the light-emitting device having such a structure, in general, the use of light-emitting materials having respective light emission wavelengths is effective. In view of the practicality and efficiency, a blue fluorescent material, a red phosphorescent material, and a green phosphorescent material are often used. In the light-emitting device here, a blue fluorescent material is used for the second EL layer 103*j*, and a red phosphorescent material and a green phosphorescent material are used for the third EL layer 103*k*.

Since the third EL layer 103*k* in the EL layer with the eighth structure contains the red and green phosphorescent materials, light in which red light and green light are synthesized is obtained from the second and third light-emitting elements. Therefore, light from the second light-emitting element is extracted outside the light-emitting device through a green color filter, whereby green light emission can be obtained, and light from the third light-emitting element is extracted outside the light-emitting device through a red color filter, whereby red light emission can be obtained.

In the light-emitting device having such a structure, supposing that excitons are divided between the red phosphorescent material and the green phosphorescent material half and half (1:1) in the third EL layer 103*k*, the external quantum efficiency of the blue pixel is $25 \times \chi_A$ % (in the case where a color filter is not used; it is $25 \times \chi_{CF}$ % in the case where a color filter is used), and the external quantum efficiency of the green pixel and that of the red pixel are each $50 \times \chi_{CF}$ %.

Next, the light-emitting device having the structure shown in FIG. 3D will be considered. The external quantum efficiency of the blue pixel is $25 \times \chi_A$ % (in the case where a color filter is not used; it is $25 \times \chi_{CF}$ % in the case where a color filter is used), the external quantum efficiency of the green pixel is $25 \times \chi_{CC}$ %, and the external quantum efficiency of the red pixel is $100 \times \chi_{CC}$ %. In this way, the use of the structure of one embodiment of the present invention can provide a light-emitting device with favorable external quantum efficiency of the red pixel.

Here, the external quantum efficiency of the red pixel with the structure of this embodiment is $100 \times \chi_{CC}$ %, whereas that with the conventional structure is $50 \times \chi_{CF}$ %, which means that the external quantum efficiency of the red pixel with the structure of this embodiment e is expected to be twice that with the conventional structure, in the case where the transmittance of the color filter and the PL quantum yield of the color conversion layer are the same. Accordingly, as long as the PL quantum yield of the color conversion layer is greater than or equal to 50% of the transmittance of the color filter, a red pixel with the external quantum efficiency higher than that of the conventional red pixel can be obtained, and power consumption of the light-emitting device can be reduced.

Figure 4D:
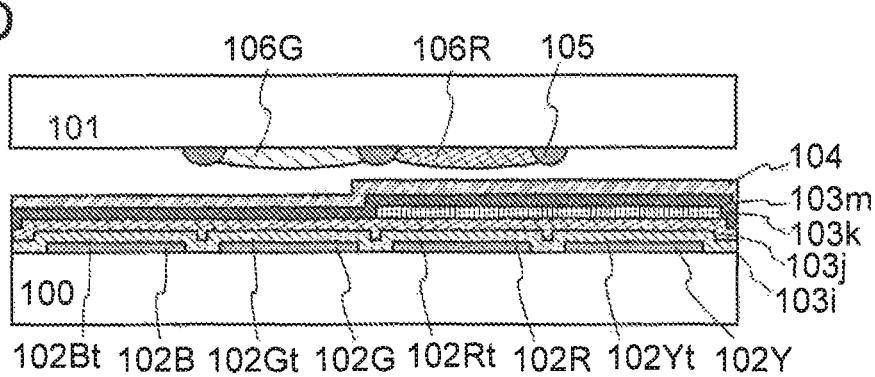

As shown in FIG. 4D, a fourth light-emitting element that constitutes a yellow pixel may be added to the structure shown in FIG. 3D. The fourth light-emitting element includes the EL layer with the eighth structure between a first electrode 102Y and the second electrode 104. The external quantum efficiency of the yellow pixel is $100 \times \chi_{CF}$ % in the case where light emitted from the fourth light-emitting element is extracted outside the light-emitting device through a color filter 107Y, or $100 \times \chi_A$ % in the case where a color filter is not provided.

The light-emitting device having such a structure can express an image with four colors, i.e., red, green, blue, and yellow, and is excellent in color reproducibility. In addition, since yellow light has a high luminosity factor, power consumption can be reduced.

Note that in the case where the structure shown in FIG. 4D is employed, white light can be expressed only with red, blue, and yellow light, and thus the efficiency of green light hardly affects the power consumption. Accordingly, even when the efficiency of the green pixel is reduced, blue light emission and red light emission are comparable to those of a conventional light-emitting element and a highly efficient light-emitting device can be obtained as long as the PL quantum yield of the color conversion layer 106R, which is a first color conversion layer provided in the red pixel, is greater than or equal to 50% of the transmittance of a red color filter.

Only one selective deposition step that uses a mask can bring these effects to the light-emitting device with the structure of this embodiment.

For each of the color conversion layers 106R, 106G, and 106Y used in the above-described light-emitting devices, any color conversion layer may be used as long as it can convert light with a desired wavelength into light with a desired wavelength with desired efficiency. The typical examples include a color conversion layer using a fluorescent pigment and a color conversion layer using quantum dots. A color conversion layer using quantum dots is easily used because it can convert light with a wide range of wavelength. In addition, the spectrum of the light converted by a color conversion layer using quantum dots is sharp; therefore, light with high color purity can be obtained and a light-emitting device with excellent color reproducibility can be provided.

<Light-Emitting Element>

Figure 5C:
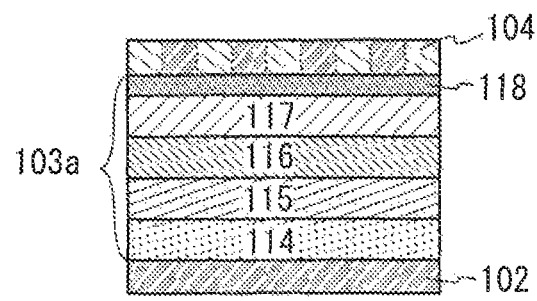

Next, an example of a light-emitting element which is one embodiment of the present invention will be described in detail below with reference to FIGS. 5A to 5C.

In this embodiment, the light-emitting element includes a pair of electrodes, i.e., a first electrode 102 and a second electrode 104, and an EL layer 103 (or an EL layer 103d or an EL layer 103a) provided between the first electrode 102 and the second electrode 104. Note that the first electrode 102 functions as an anode and that the second electrode 104 functions as a cathode.

Since the first electrode 102 functions as the anode, the first electrode 102 is preferably formed using any of metals, alloys, electrically conductive compounds with a high work function (specifically, a work function of 4.0 eV or more), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, indium oxide-zinc oxide is deposited by a sputtering method using a target obtained by adding 1 wt % to 20 wt % of zinc oxide to indium oxide. Further, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used. Graphene can also be used. Note that when a composite material described later is used for a layer which is in contact with the first electrode 102 in the EL layer 103, an electrode material can be selected regardless of its work function.

The EL layer 103 (or the EL layer 103d or the EL layer 103a) has a stacked layer structure, and the combination of a hole-injection layer, a hole-transport layer, a light-emitting layer, an electron-transport layer, an electron-injection layer, a carrier-blocking layer, an intermediate layer, and the like can be included therein as appropriate. In this embodiment, the basic structure of the EL layer 103 (or the EL layer 103d or the EL layer 103a) in which the hole-injection layer 114, the hole-transport layer 115, the light-emitting layer 116, the electron-transport layer 117, and the electron-injection layer 118 are stacked in this order over the first electrode 102 will be described. Specific examples of the materials forming the layers are given below.

The hole-injection layer 114 is a layer that contains a substance having a high hole-injection property. As the substance having a high hole-injection property, for example, molybdenum oxide, vanadium oxide, ruthenium oxide, tungsten oxide, manganese oxide, or the like can be used. Alternatively, the hole-injection layer 114 can be formed using a phthalocyanine-based compound such as phthalocyanine (abbreviation: H$_2$Pc) or copper phthalocyanine (abbreviation: CuPc), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-diphenyl-(1,1'-biphenyl)-4,4'-diamine (abbreviation: DNTPD), a high molecular compound such as poly(3,4-ethylenedioxythiophene)/poly(styrenesulfonic acid) (abbreviation: PEDOT/PSS), or the like.

Alternatively, a composite material in which a substance having a hole-transport property contains a substance having an acceptor property can be used for the hole-injection layer 114. Note that the use of such a substance having a hole-transport property which contains a substance having an acceptor property enables selection of a material used to form an electrode regardless of its work function. In other words, besides a material having a high work function, a material having a low work function can also be used for the first electrode 102. As the substance having an acceptor property, 7,7,8,8-tetracyano-2,3,5,6-tetrafluoroquinodimethane (abbreviation: F$_4$-TCNQ), chloranil, and the like can be given. In addition, transition metal oxides can be given. Moreover, an oxide of metals belonging to Groups 4 to 8 of the periodic table can be used. Specifically, it is preferable to use vanadium oxide, niobium oxide, tantalum oxide, chromium oxide, molybdenum oxide, tungsten oxide, manganese oxide, and rhenium oxide because of their high electron accepting properties. In particular, molybdenum oxide is more preferable because of its stability in the atmosphere, low hygroscopic property, and easiness of handling.

As the substance having a hole-transport property that is used for the composite material, any of a variety of organic compounds such as aromatic amine compounds, carbazole derivatives, aromatic hydrocarbons, and high molecular compounds (e.g., oligomers, dendrimers, or polymers) can be used. The organic compound used for the composite material is preferably an organic compound having a high hole-transport property. Specifically, use of a substance having a hole mobility of greater than or equal to $10^{-6}$ cm$^2$/(V·s) is preferable. Organic compounds that can be used as the substance having a hole-transport property in the composite material are specifically given below.

As the aromatic amine compound, for example, there are N,N'-di(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); N,N'-bis{4-[bis(3-methylphenyl)amino]phenyl}-N,N'-diphenyl-(1,1'-biphenyl)-4,4'-diamine (abbreviation: DNTPD); 1,3,5-tris[N-(4-diphenylaminophenyl)-N-phenylamino]benzene (abbreviation: DPA3B); and the like.

The carbazole derivative that can be used for the composite material is specifically 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), or the like.

Other examples of the carbazole derivatives which can be used for the composite material include 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene.

Examples of the aromatic hydrocarbons each of which can be used for the composite material include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, or the like can also be used. As these aromatic hydrocarbons given here, it is preferable that an aromatic hydrocarbon having a hole mobility of $1 \times 10^{-6}$ cm$^2$/Vs or more and having 14 to 42 carbon atoms be used.

The aromatic hydrocarbons each of which can be used for the composite material may have a vinyl skeleton. As aromatic hydrocarbon having a vinyl group, the following is given, for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Moreover, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenyl amino}phenyl) methacrylamide] (abbreviation: PTPDMA), or poly[N,N-bis (4-butylphenyl)-N,N-bis(phenyl)benzidine (abbreviation: Poly-TPD) can also be used.

By providing a hole-injection layer, a high hole-injection property can be achieved to allow a light-emitting element to be driven at a low voltage.

The hole-transport layer 115 is a layer that contains a substance having a hole-transport property. Examples of the substance having a hole-transport property are aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(N,N-diphenylamino) triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), and the like. The substances mentioned here have high hole-transport properties and are mainly ones that have a hole mobility of $10^{-6}$ cm$^2$/Vs or more. An organic compound given as an example of the substance having a hole-transport property in the composite material described above can also be used for the hole-transport layer 115. Moreover, a high molecular compound such as poly (N-vinylcarbazole) (abbreviation: PVK) and poly(4-vinyltriphenylamine) (abbreviation: PVTPA) can also be used. Note that the layer that contains a substance having a hole-transport property is not limited to a single layer, and may be a stack of two or more layers including any of the above substances.

The electron-transport layer 117 is a layer containing a substance having an electron-transport property. The materials having an electron-transport property or having an anthracene skeleton, which are described above as materials for the host material, can be used.

Between the electron-transport layer and the light-emitting layer, a layer that controls transport of electron carriers may be provided. This is a layer formed by addition of a small amount of a substance having a high electron-trapping property to a material having a high electron-transport property described above, and the layer is capable of adjusting carrier balance by suppressing transfer of electron carriers. Such a structure is very effective in preventing a problem (such as a reduction in element lifetime) caused when electrons pass through the light-emitting layer.

In addition, an electron-injection layer 118 may be provided between the electron-transport layer 117 and the second electrode 104, in contact with the second electrode 104. For the electron-injection layer 118, an alkali metal, an alkaline earth metal, or a compound thereof such as lithium fluoride (LiF), cesium fluoride (CsF), or calcium fluoride (CaF$_2$) can be used. For example, a layer that is formed using a substance having an electron-transport property and contains an alkali metal, an alkaline earth metal, or a compound thereof can be used. An electride may also be used for the electron-injection layer 118. Examples of the electride include a substance in which electrons are added at high concentration to calcium oxide-aluminum oxide. Note that it is preferable to use the layer formed of a substance having an electron-transport property in which an alkali metal or an alkaline earth metal is mixed as the electron injection layer 118 because electrons can be efficiently injected from the second electrode 104.

For the second electrode 104, any of metals, alloys, electrically conductive compounds, and mixtures thereof which have a low work function (specifically, a work function of 3.8 eV or less) or the like can be used. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys thereof (e.g., MgAg and AlLi), rare earth metals such as europium (Eu) and ytterbium (Yb), alloys thereof, and the like. However, when the electron-injection layer is provided between the second electrode 104 and the electron-transport layer, for the second electrode 104, any of a variety of conductive materials such as Al, Ag, ITO, or indium oxide-tin oxide containing silicon or silicon oxide can be used regardless of the work function. These conductive materials can be deposited by a sputtering method, an ink-jet method, a spin coating method, or the like.

Any of various methods can be employed for forming the EL layer 103 (or the EL layer 103*d* or the EL layer 103*a*) regardless of whether it is a dry method or a wet method. For example, a vacuum evaporation method, an ink jet method, or a spin coating method may be employed. Further, a different deposition method can be employed for each electrode or each layer.

The electrodes may be formed by a wet method using a sol-gel method, or by a wet method using paste of a metal material. Alternatively, the electrodes may be formed by a dry method such as a sputtering method or a vacuum evaporation method.

Light emission from the light-emitting element is extracted outside through one or both of the first electrode 102 and the second electrode 104. Therefore, one or both of the first electrode 102 and the second electrode 104 are formed as light-transmitting electrodes.

<Tandem Element>

Next, an embodiment of a light-emitting element with a structure in which a plurality of light-emitting units are stacked (hereinafter this type of light-emitting element is also referred to as a tandem light-emitting element) will be described with reference to FIG. 5A. This light-emitting element includes a plurality of light-emitting units between a pair of electrodes (a first electrode 102 and a second electrode 104). One light-emitting unit has the same structure as the EL layer 103a shown in FIG. 5C. In other words, the light-emitting element shown in FIG. 5C includes one light-emitting unit while the light-emitting element shown in FIG. 5A includes a plurality of light-emitting units.

In FIG. 5A, the EL layer 103 including a stack of the first light-emitting unit 103b, the intermediate layer 109 that corresponds to a charge generation layer, and the second light-emitting unit 103c is formed between the first electrode 102 and the second electrode 104. One of the first light-emitting unit 103b and the second light-emitting unit 103c is a unit that emits blue fluorescence, and the other is a unit that emits green or yellow phosphorescence. Light in which blue fluorescence and green or yellow phosphorescence are synthesized is obtained from the EL layer 103.

The tandem element has a structure in which light-emitting units each corresponding to the EL layer 103a are connected in series with the intermediate layer 109 positioned therebetween. Thus, a fluorescent layer and a phosphorescent layer can be separated from each other, and both fluorescence and phosphorescence can be obtained easily from one light-emitting element.

The intermediate layer 109 includes a composite material of an organic compound and a metal oxide. As this composite material of an organic compound and a metal oxide, the composite material that can be used for the hole-injection layer 114 can be used. Since the composite material of an organic compound and a metal oxide is superior in carrier-injecting property and carrier-transporting property, low-voltage driving or low-current driving can be achieved. Note that when a surface of a light-emitting unit on the anode side is in contact with the intermediate layer, the intermediate layer can also serve as a hole-injection layer of the light-emitting unit; thus, a hole-injection layer does not need to be formed in the light-emitting unit.

Note that the intermediate layer 109 may be formed by stacking a layer containing the above composite material and a layer containing another material. For example, a layer containing the above composite material and a layer containing a compound with a high electron-transport property and a compound selected from the compounds with an electron donating property may be stacked. Alternatively, a layer containing a composite material of an organic compound and a metal oxide and a transparent conductive film may be stacked.

An electron-injection buffer layer may be provided between the intermediate layer 109 and the light-emitting unit on the anode side of the intermediate layer. The electron-injection buffer layer is a stack of a very thin film of an alkali metal and an electron-relay layer containing a substance having an electron-transport property. The very thin film of the alkali metal corresponds to the electron-injection layer 118 and has a function of lowering an electron-injection barrier. The electron-relay layer has a function of preventing an interaction between the film of the alkali metal and the intermediate layer and smoothly transferring electrons. The LUMO level of the substance having an electron-transport property which is contained in the electron-relay layer is set to be between the LUMO level of a substance having an acceptor property in the intermediate layer 109 and the LUMO level of a substance contained in a layer in contact with the electron-injection buffer layer in the light-emitting unit on the anode side. As a specific value of the energy level, the LUMO level of the substance having an electron-transport property that is contained in the electron-relay layer is preferably greater than or equal to −5.0 eV, more preferably greater than or equal to −5.0 eV and less than or equal to −3.0 eV. Note that as the substance having an electron-transport property that is contained in the electron-relay layer, a metal complex having a metal-oxygen bond and an aromatic ligand or a phthalocyanine-based material is preferably used. In that case, the film of the alkali metal of the electron-injection buffer layer serves as the electron-injection layer in the light-emitting unit on the anode side; thus, the electron-injection layer does not need to be formed over the light-emitting unit.

In any event, the intermediate layer 109 interposed between the first light-emitting unit 103b and the second light-emitting unit 103c is acceptable as long as it injects electrons to one of the light-emitting units and injects holes to the other light-emitting unit when a voltage is applied to the first electrode 102 and the second electrode 104.

<Fluorescent/Phosphorescent Single Element>

Next, a fluorescent/phosphorescent single element with one light-emitting unit including both a fluorescent layer and a phosphorescent layer will be described with reference to FIG. 5B. A light-emitting element shown in FIG. 5B has a structure in which two light-emitting layers (a first light-emitting layer 116d-1 and a second light-emitting layer 116d-2) are adjacent to each other in the EL layer 103d.

One of the first light-emitting layer 116d-1 and the second light-emitting layer 116d-2 emits blue fluorescence and the other emits green or yellow phosphorescence. Light in which blue fluorescence and green or yellow phosphorescence are synthesized is obtained from the EL layer 103d.

The first light-emitting layer 116d-1 or the second light-emitting layer 116d-2, which is a phosphorescent layer, contains a first organic compound, a second organic compound, and a phosphorescent material, and it is preferable that the first organic compound and the second organic compound form an exciplex and energy transfer occur from the exciplex to the phosphorescent material. With such a structure, phosphorescence is not quenched even when the fluorescent layer and the phosphorescent layer are adjacent to each other, and fluorescence and phosphorescence can be obtained efficiently at the same time.

When a fluorescent layer and a phosphorescent layer are included in the same EL layer to emit light, the triplet excitation energy of the phosphorescent layer is generally transferred to a host material occupying a large part of the fluorescent layer. This causes a significant reduction in emission efficiency. The reason is as follows: since a substance having a condensed aromatic ring (especially, a condensed aromatic hydrocarbon ring) skeleton, which is typified by anthracene that has a low triplet level, is generally used as a host material, triplet excitation energy generated in the phosphorescent layer is transferred to the host material in the fluorescent layer, which results in nonradiative decay. At present, it is difficult to obtain a desired emission wavelength and favorable element characteristics or reliability without using a substance having a condensed aromatic ring skeleton in the fluorescent layer; thus, the structure in which the fluorescent layer and the phosphorescent layer are included in the same EL layer makes it difficult to obtain a light-emitting element having favorable characteristics.

Since a triplet excited state has a long relaxation time, the diffusion length of an exciton is long, many of the excitons generated in the phosphorescent layer are transferred to the fluorescent layer because of diffusion, and non-radiative decay of the excitons is caused. This further reduces the emission efficiency of the phosphorescent layer.

In a light-emitting element of this embodiment, the first organic compound and the second organic compound form an exciplex in the phosphorescent layer, and the triplet excitation energy is transferred from the exciplex to the phosphorescent substance, so that light emission can be obtained. This structure can solve the above-described problems.

An exciplex is an excited state formed from two kinds of substances. The two kinds of substances that have formed the exciplex return to a ground state by emitting light and serve as the original two kinds of substances. In other words, an exciplex itself does not have a ground state, and energy transfer between exciplexes or energy transfer to an exciplex from another substance is unlikely to occur accordingly in principle.

Most excitons in the phosphorescent layer exist as exciplexes. Furthermore, the singlet-excitation energy of the exciplex is smaller than that of the first organic compound and that of the second organic compound. When the first organic compound and the second organic compound are selected such that the triplet-excitation energy of the exciplex is smaller than that of the first organic compound or that of the second organic compound, energy transfer hardly occurs from the exciplex to the first organic compound and the second organic compound. In addition, since energy transfer among exciplex hardly occurs as described above, almost all of excitation energy of the exciplex is transferred to the phosphorescent substance and converted into light emission. Accordingly, diffusion of excitons in the phosphorescent layer hardly occurs. As a result, both fluorescence and phosphorescence can be obtained from one EL layer.

Here, in the case where the fluorescent layer and the phosphorescent layer are formed in contact with each other, energy transfer (in particular, triplet energy transfer) can occur from the exciplex to the host material in the fluorescent layer at the interface. However, diffusion of the excitons in the phosphorescent layer hardly occurs as described above; thus, energy transfer from the exciplex to the host material in the fluorescent layer occurs in a very limited area (i.e., the interface between the fluorescent layer and the phosphorescent layer), and large loss of the excitation energy does not occur. Therefore, the fluorescent layer and the phosphorescent layer need not necessarily be in contact with each other, and even if they are contact with each other, both fluorescence and phosphorescence can be obtained with high efficiency. Note that a separation layer with a thickness of less than or equal to 20 nm may be provided between the fluorescent layer and the phosphorescent layer. The provision of the separation layer can suppress energy transfer at the interface between the fluorescent layer and the phosphorescent layer, whereby light emission can be obtained with higher efficiency. It is preferable that the separation layer be greater than or equal to 1 nm and less than or equal to 10 nm in thickness. In addition, it is preferable that the separation layer include the first organic compound and the second organic compound that are also included in the phosphorescent layer, in which case the effect of suppressing the transfer of excitation energy is increased.

The materials included in the light-emitting layer 116, the first light-emitting layer 116d-1, and the second light-emitting layer 116d-2 will be described below.

Examples of the fluorescent substances include substances which exhibit blue light emission (emission wavelength: 400 nm to 480 nm) such as N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N'-bis[4-(9-phenyl-9H-fluoren-9-yl)phenyl]-N,N'-diphenylpyrene-1,6-diamine (abbreviation: 1,6FLPAPrn), and N,N'-bis(3-methylphenyl)-N,N'-bis[3-(9-phenyl-9H-fluoren-9-yl)phenyl]pyrene-1,6-diamine (abbreviation: 1,6mMemFLPAPrn). Condensed aromatic diamine compounds typified by pyrenediamine compounds such as 1,6FLPAPrn and 1,6mMemFLPAPrn are particularly preferable because of their high hole-trapping properties, high emission efficiency, and high reliability.

Examples of materials that can be used as the phosphorescent substance are as follows.

Examples of the compound that mainly emits green phosphorescence include organometallic iridium complexes having pyrimidine skeletons, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), and (acetylacetonato)bis[6-(2-norbornyl)-4-phenylpyrimidinato]iridium(III) (abbreviation: Ir(nbppm)$_2$(acac)); organometallic iridium complexes having pyridine skeletons, such as tris(2-phenylpyridinato-N,C$^{2'}$)iridium(III) (abbreviation: Ir(ppy)$_3$), and bis(2-phenylpyridinato-N,C$^{2'}$)iridium(III) acetylacetonate (abbreviation: Ir(ppy)$_2$(acac)); and a rare earth metal complex such as tris(acetylacetonato)(monophenanthroline)terbium(III) (abbreviation: Tb(acac)$_3$(Phen)). Note that an organometallic iridium complex having a pyrimidine skeleton has distinctively high reliability and emission efficiency and thus is especially preferable.

Examples of the compound that mainly emits yellow phosphorescence include organometallic iridium complexes having pyrimidine skeletons, such as (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)$_2$(acac)), and (acetylacetonato)bis(4,6-diphenylpyrimidinato)iridium(III) (abbreviation: Ir(dppm)$_2$(acac)); organometallic iridium complexes having pyrazine skeletons, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having pyridine skeletons, such as tris(2-phenylquinolinato-N,C$^{2'}$)iridium(III) (abbreviation: Ir(pq)$_3$), bis(2-phenylquinolinato-N,C$^{2'}$)iridium(III) acetylacetonate (abbreviation: Ir(pq)$_2$(acac)), bis(benzo[h]quinolinato)iridium(III) acetylacetonate (abbreviation: [Ir(bzq)$_2$(acac)]), and bis{2-[4'-(perfluorophenyl)phenyl]pyridinato-N,C$^{2'}$}iridium(III) acetylacetonate (abbreviation: Ir(p-PF-ph)$_2$(acac)); and bis(2- phenylbenzothiazolato-N,C$^{2'}$)iridium(III) acetylacetonate (abbreviation: Ir(bt)$_2$(acac)). Note that an organometallic iridium complex having a pyrimidine skeleton has distinctively high reliability and emission efficiency and thus is especially preferable.

As a host material, various carrier-transport materials, such as a material having an electron-transport property or a material having a hole-transport property can be used. The host material in the phosphorescent layer preferably includes two kinds of substances, i.e., a first organic compound and a second organic compound. Furthermore, a combination of the first organic compound and the second organic compound preferably forms an exciplex. In addition, it is preferable that one of the first organic compound and the second organic compound have an electron-transport property and the other have a hole-transport property, because such a structure is advantageous when forming an exciplex.

Furthermore, when a combination of these materials is selected so as to form an exciplex that exhibits light emission whose wavelength overlaps the wavelength of a lowest-energy-side absorption band of the fluorescent substance or the phosphorescent substance, energy is transferred smoothly and light emission can be obtained efficiently. Such a combination is preferable in that drive voltage can be reduced.

Examples of the material having an electron-transport property are a metal complex such as bis(10-hydroxybenzo [h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato] zinc (II) (abbreviation: ZnBTZ); a heterocyclic compound having a polyazole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1, 3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II); a heterocyclic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II); and a heterocyclic compound having a pyridine skeleton, such as 3,5-bis[3-(9H-carbazol-9-yl)phenyl]pyridine (abbreviation: 35DCzPPy) or 1,3,5-tri[3-(3-pyridyl)-phenyl]benzene (abbreviation: TmPyPB). Among the above materials, a heterocyclic compound having a diazine skeleton and a heterocyclic compound having a pyridine skeleton have high reliability and are thus preferable. Specifically, a heterocyclic compound having a diazine (pyrimidine or pyrazine) skeleton has a high electron-transport property and contributes to a reduction in drive voltage.

Examples of the material having a hole-transport property include a compound having an aromatic amine skeleton, such as 4,4'-bis[N-(1-naphthyl)-N-phenylamino]biphenyl (abbreviation: NPB), N,N'-bis(3-methylphenyl)-N,N-diphenyl[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl) triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl) triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton, such as 4,4',4''-(benzene-1,3,5-triyl)tri(dibenzofuran) (abbreviation: DBF3P-II) or 4-{3-[3-(9-phenyl-9H-fluoren-9-yl)phenyl] phenyl}dibenzofuran (abbreviation: mmDBFFLBi-II). Among the above materials, a compound having an aromatic amine skeleton and a compound having a carbazole skeleton are preferable because these compounds are highly reliable, have high hole-transport properties, and contribute to a reduction in drive voltage. Hole-transport materials can be selected from a variety of substances as well as from the hole-transport materials given above.

Note that the host material may be a mixture of a plurality of kinds of substances, and in the case of using a mixed host material, it is preferable to mix a material having an electron-transport property with a material having a hole-transport property. By mixing the material having an electron-transport property with the material with a hole-transport property, the transport property of the light-emitting layer 116, the first light-emitting layer 116d-1, and the second light-emitting layer 116d-2 can be easily adjusted and a recombination region can be easily controlled. The ratio of the content of the material having a hole-transport property to the content of the material having an electron-transport property may be 1:9 to 9:1.

As the host material in the fluorescent layer, materials having an anthracene skeleton such as 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo [b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA) are particularly preferable. The use of a substance having an anthracene skeleton as the host material makes it possible to obtain a light-emitting layer with high emission efficiency and high durability. In particular, CzPA, cgDBCzPA, 2mBnfPPA, and PCzPA are preferable choices because of their excellent characteristics.

The light-emitting layer 116, the first light-emitting layer 116d-1, and the second light-emitting layer 116d-2 having the above-described structure can be formed by co-evaporation by a vacuum evaporation method, or an inkjet method, a spin coating method, a dip coating method, or the like using a mixed solution.

<Micro Optical Resonator (Microcavity) Structure>

A light-emitting element with a microcavity structure is formed with the use of a reflective electrode and a semi-transmissive and semi-reflective electrode as the pair of electrodes. The reflective electrode and the semi-transmissive and semi-reflective electrode correspond to the first electrode and the second electrode. At least an EL layer is provided between the reflective electrode and the semi-transmissive and semi-reflective electrode, and the EL layer includes at least a light-emitting layer serving as a light-emitting region.

Note that such a structure can be effectively used particularly when obtaining green light emission with a light-emitting device using blue fluorescence and yellow phosphorescence.

In order to obtain green light emission with the light-emitting device using blue fluorescence and yellow phosphorescence, which is one embodiment of the present invention, blue fluorescence needs to be converted into green light with a color conversion layer. At that time, the color purity of green light may deteriorate if yellow light is mixed. Although yellow light emission may be cut with the use of a color filter, amplifying blue light emission and attenuating yellow light emission with the use of a resonant structure is preferable because energy loss is relatively small.

Light emitted in all directions from the light-emitting layer included in the EL layer is reflected and resonated by the reflective electrode and the semi-transmissive and semi-reflective electrode. Note that the reflective electrode is formed using a conductive material having reflectivity, and a film whose visible light reflectivity is 40% to 100%, preferably 70% to 100%, and whose resistivity is $1 \times 10^{-2}$ Ωcm or lower is used. In addition, the semi-transmissive and semi-reflective electrode is formed using a conductive material having reflectivity and a light-transmitting property, and a film whose visible light reflectivity is 20% to 80%, preferably 40% to 70%, and whose resistivity is $1 \times 10^{-2}$ Ωcm or lower is used.

In the light-emitting element, by changing thicknesses of the transparent conductive film, the composite material, the carrier-transport material, and the like, the optical path length between the reflective electrode and the semi-transmissive and semi-reflective electrode can be changed. Thus, light with a wavelength that is resonated between the reflective electrode and the semi-transmissive and semi-reflective electrode can be intensified while light with a wavelength that is not resonated therebetween can be attenuated.

Note that light that is reflected back by the reflective electrode (first reflected light) considerably interferes with light that directly enters the semi-transmissive and semi-reflective electrode from the light-emitting layer (first incident light). For this reason, the optical path length between the reflective electrode and the light-emitting layer is preferably adjusted to $(2n-1)\lambda/4$ (n is a natural number of 1 or larger and $\lambda$ is a wavelength of light to be amplified). By adjusting the optical path length, the phases of the first reflected light and the first incident light can be aligned with each other and the light emitted from the light-emitting layer can be further amplified.

Note that in the above structure, the EL layer may be formed of light-emitting layers or may be a single light-emitting layer. The tandem light-emitting element described above may be combined with the EL layers; for example, a light-emitting element may have a structure in which a plurality of EL layers is provided, a charge-generation layer is provided between the EL layers, and each EL layer is formed of light-emitting layers or a single light-emitting layer.

With the microcavity structure, emission intensity with a specific wavelength in the front direction can be increased, whereby power consumption can be reduced. In particular, a light-emitting element that uses the 1,6-bis(diphenylamino)pyrene derivative, which has a narrow half width of an emission spectrum and a sharp spectrum, as an emission center substance can have excellent emission efficiency because the microcavity structure brings a significant light emission amplification effect.

<Light-Emitting Device>

Figure 6A:
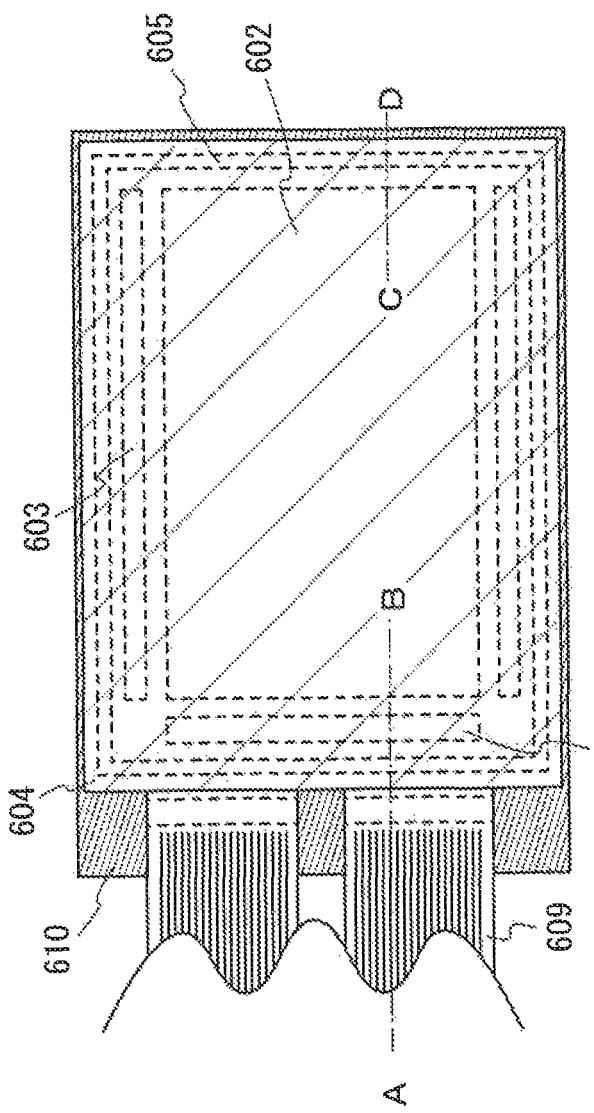
FIGS. 6A and 6B are conceptual diagrams of an active matrix light-emitting device.
Figure 6B:
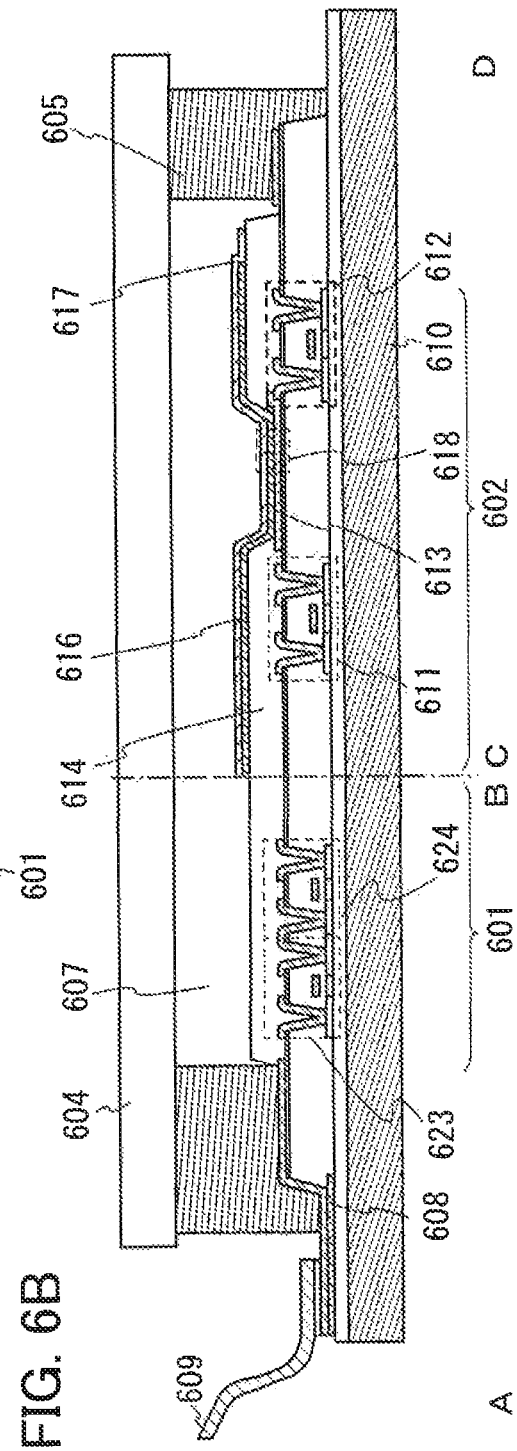

A light-emitting device of one embodiment of the present invention will be described with reference to FIGS. 6A and 6B. Note that FIG. 6A is a top view of the light-emitting device and FIG. 6B is a cross-sectional view taken along the lines A-B and C-D in FIG. 6A. This light-emitting device includes a driver circuit portion (source line driver circuit) 601, a pixel portion 602, and a driver circuit portion (gate line driver circuit) 603, which are to control light emission of a light-emitting element and illustrated with dotted lines. A reference numeral 604 denotes a sealing substrate; 605, a sealant; and a portion surrounded by the sealant 605 is a space 607.

A reference numeral 608 denotes a wiring for transmitting signals to be input to the source line driver circuit 601 and the gate line driver circuit 603 and receiving signals such as a video signal, a clock signal, a start signal, and a reset signal from a flexible printed circuit (FPC) 609 serving as an external input terminal. Although only the FPC is shown here, the FPC may be provided with a printed wiring board (PWB). The light emitting device in this specification includes not only a main body of the light emitting device but also the light emitting device with an FPC or a PWB attached.

Next, a cross-sectional structure is described with reference to FIG. 6B. The driver circuit portion and the pixel portion are formed over an element substrate 610; FIG. 6B shows the source line driver circuit 601, which is a driver circuit portion, and one of the pixels in the pixel portion 602.

As the source line driver circuit 601, a CMOS circuit in which an n-channel FET 623 and a p-channel FET 624 are combined is formed. The driver circuit may be formed with various types of circuits, such as CMOS circuits, PMOS circuits, or NMOS circuits. A driver integration type in which a driver circuit is formed over a substrate is described in this embodiment, but it is not necessarily required and a driver circuit can be formed outside a substrate, not over the substrate.

The pixel portion 602 includes a plurality of pixels including a switching FET 611, a current controlling FET 612, and a first electrode 613 electrically connected to a drain of the current controlling FET 612. One embodiment of the present invention is not limited to the structure. The pixel portion 602 may include three or more FETs and a capacitor in combination.

The kind and crystallinity of a semiconductor used for the FETs is not particularly limited; an amorphous semiconductor or a crystalline semiconductor may be used. Examples of the semiconductor used for the FETs include Group 13 semiconductors (e.g., gallium), Group 14 semiconductors (e.g., silicon), compound semiconductors, oxide semiconductors, and organic semiconductors materials. Oxide semiconductors are particularly preferable. Examples of the oxide semiconductor include an In—Ga oxide and an In-M-Zn oxide (M is Al, Ga, Y, Zr, La, Ce, or Nd). Note that an oxide semiconductor that has an energy gap of 2 eV or more, preferably 2.5 eV or more, further preferably 3 eV or more is preferably used for a transistor, in which case the off-state current of the transistors can be reduced.

An insulator 614 is formed to cover an edge of the first electrode 613. In this embodiment, the insulator 614 can be formed using a positive photosensitive acrylic resin film The insulator 614 is formed to have a curved surface with curvature at an upper edge or a lower edge thereof in order to obtain favorable coverage. For example, in the case where positive photosensitive acrylic is used for a material of the insulator 614, only the upper end portion of the insulator 614 preferably has a curved surface with a curvature radius (0.2 µm to 3 µm). As the insulator 614, either a negative photosensitive resin or a positive photosensitive resin can be used.

An EL layer 616 and a second electrode 617 are formed over the first electrode 613. The first electrode 613, the EL layer 616, and the second electrode 617 correspond to the first electrode 102, the EL layer 103 (or the EL layer 103d or the EL layer 103a), and the second electrode 104, which are described with reference to FIGS. 5A to 5C, respectively.

By attaching the sealing substrate 604 to the element substrate 610 with the sealant 605, a light emitting element 618 is provided in the space 607 surrounded by the element substrate 610, the sealing substrate 604, and the sealant 605. The space 607 is filled with a filler, there is a case where the space 607 is filled with the sealant 605 or filled with an inert gas (nitrogen, argon, or the like). It is preferable that the sealing substrate be provided with a recessed portion and a drying agent 625 be provided in the recessed portion, in which case deterioration due to influence of moisture can be suppressed.

An epoxy-based resin or glass frit is preferably used for the sealant 605. The material preferably allows as little moisture and oxygen as possible to penetrate. As the element substrate 610 and the sealing substrate 604, a glass substrate, a quartz substrate, or a plastic substrate formed of fiber reinforced plastic (FRP), poly(vinyl fluoride) (PVF), polyester, or acrylic can be used.

Note that in this specification and the like, a transistor or a light-emitting element can be formed using any of a variety of substrates, for example. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, a soda lime glass substrate, or the like can be given. Examples of the flexible substrate, the attachment film, the base film, and the like are substrates of plastics typified by polyethylene terephthalate (PET), polyethylene naphthalate (PEN), and polyether sulfone (PES). Other examples are substrates of synthetic resins such as acrylic. Other examples are polypropylene, polyester, polyvinyl fluoride, polyvinyl chloride, and the like. Other examples are polyamide, polyimide, aramid, epoxy, an inorganic vapor deposition film, paper, and the like. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Alternatively, a flexible substrate may be used as the substrate such that the transistor and the light-emitting element may be provided directly on the flexible substrate. Still alternatively, a separation layer may be provided between the substrate and the transistor and between the substrate and the light-emitting element. The separation layer can be used when part or the whole of a semiconductor device formed over the separation layer is separated from the substrate and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, after the transistor and the light-emitting element is formed using a substrate, the transistor and the light-emitting element may be transferred to another substrate. Examples of a substrate to which a transistor or a light-emitting element is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. When such a substrate is used, a transistor with excellent properties or a transistor with low power consumption can be formed, a device with high durability, high heat resistance can be provided, or reduction in weight or thickness can be achieved.

Figure 7A:
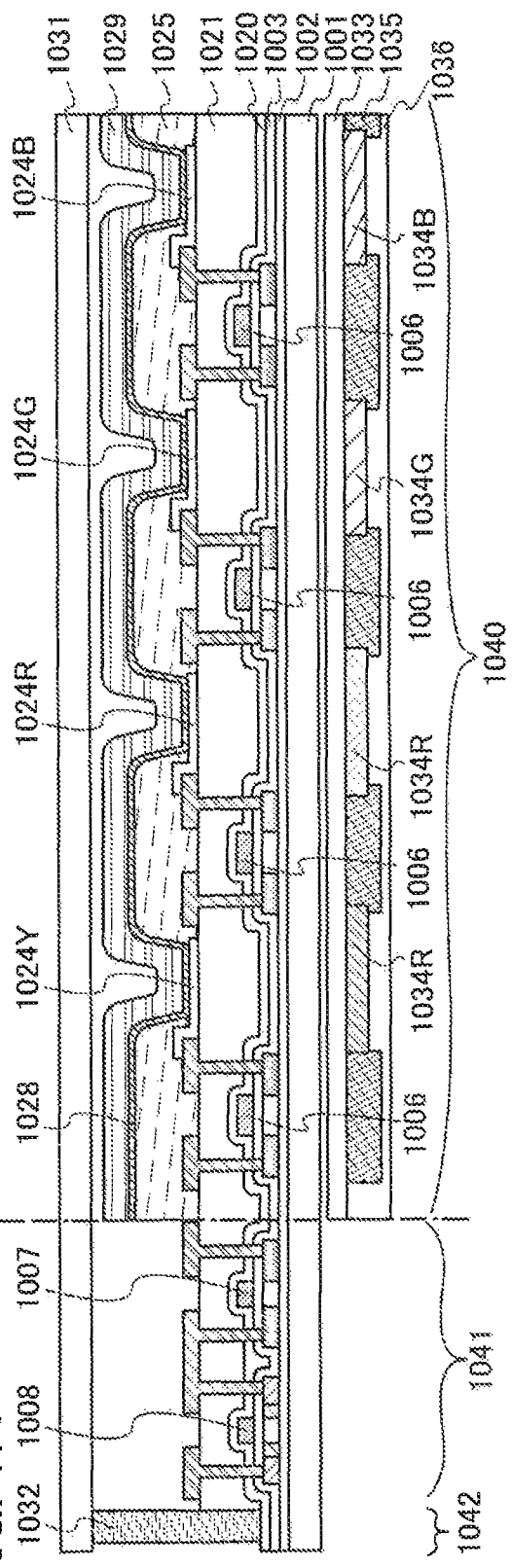
FIGS. 7A and 7B are conceptual diagrams of active matrix light-emitting devices.
Figure 7B:
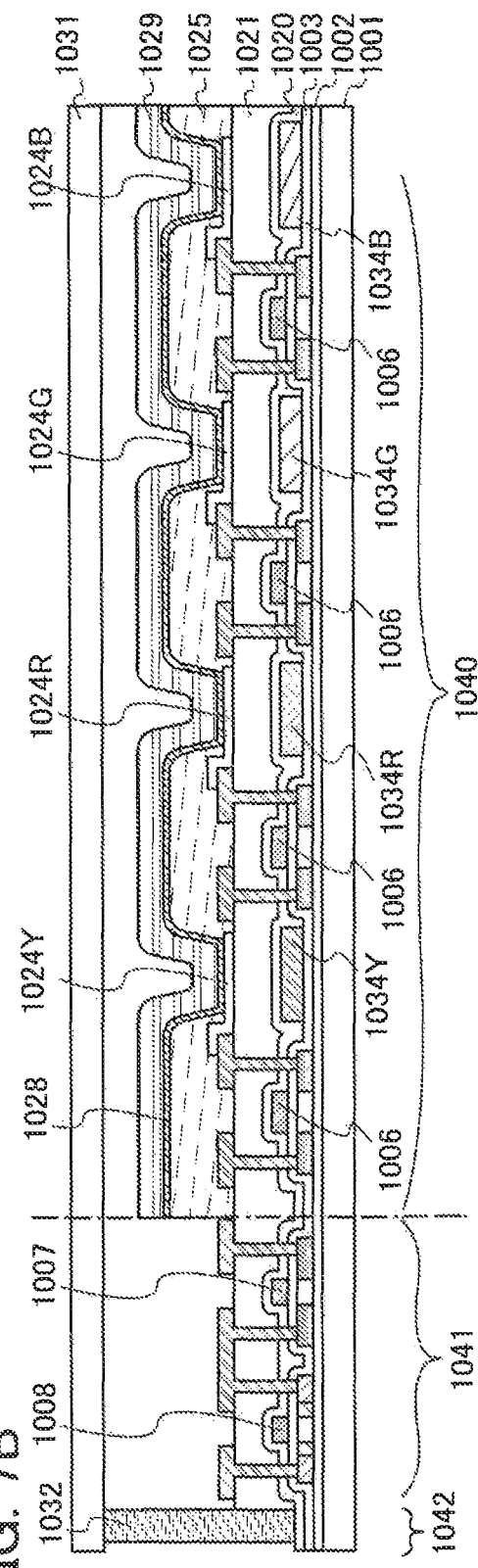

FIGS. 7A and 7B show examples of a light-emitting device of one embodiment of the invention. In FIG. 7A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024Y, 1024R, 1024G, and 1024B of light-emitting elements, a partition wall 1025, an EL layer 1028, a second electrode 1029 of the light-emitting elements, a sealing substrate 1031, a sealant 1032, and the like are shown. A structure that emits light in which blue fluorescence and green or yellow phosphorescence are synthesized is assumed as the EL layer, but one embodiment of the present invention is not limited thereto.

In FIG. 7A, a red color conversion layer 1034R, a green color conversion layer 1034G, a blue color filter layer 1034B, and a yellow color conversion layer (in the case where blue fluorescence and green phosphorescence are used) or a yellow color filter layer (in the case where blue fluorescence and yellow phosphorescence are used) 1034Y are provided on a transparent base material 1033. Further, a black layer (black matrix) 1035 may be provided. The transparent base material 1033 provided with the color filter layer, color conversion layers, and the black layer is positioned and fixed to the substrate 1001. Note that the color filter layer, the color conversion layers, and the black layer may be covered with an overcoat layer 1036.

FIG. 7B shows an example in which the color filter layer and the color conversion layers are formed between the gate insulating film 1003 and the first interlayer insulating film 1020. As in the structure, the color filter layer and the color conversion layers may be provided between the substrate 1001 and the sealing substrate 1031.

Figure 8:
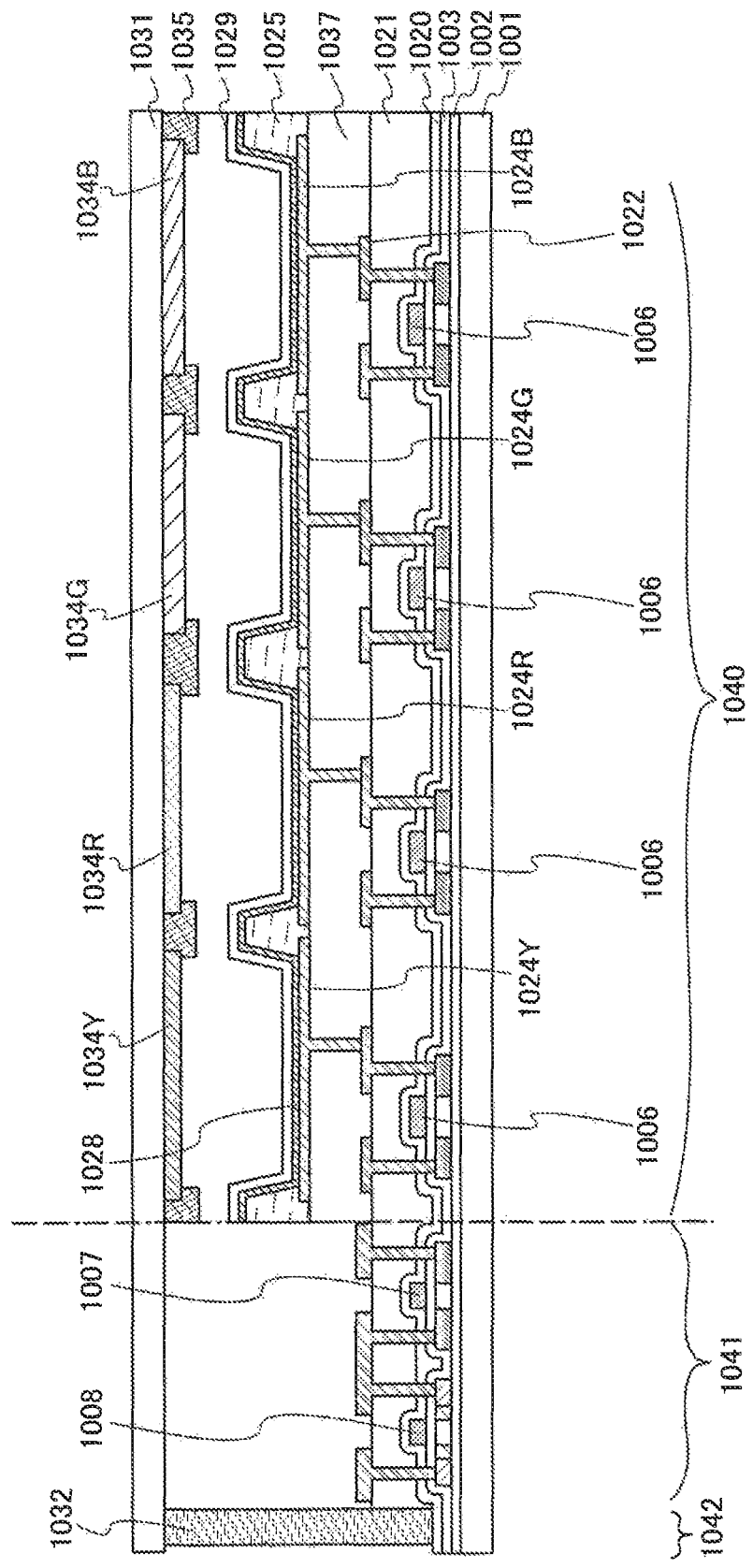
FIG. 8 is a conceptual diagram of an active matrix light-emitting device.

The above-described light-emitting device is a light-emitting device having a structure in which light is extracted from the substrate 1001 side where the FETs are formed (a bottom emission structure), but may be a light-emitting device having a structure in which light is extracted from the sealing substrate 1031 side (a top emission structure). FIG. 8 is a cross-sectional view of a light-emitting device having a top emission structure. In this case, as the substrate 1001, a substrate that does not transmit light can be used. The process up to the step of forming a connection electrode which connects the FET and the anode of the light-emitting element is performed in a manner similar to that of the light-emitting device having a bottom emission structure. Then, a third interlayer insulating film 1037 is formed to cover an electrode 1022. This insulating film may function for planarization. The third interlayer insulating film 1037 can be formed by using a material similar to that of the second interlayer insulating film, or can be formed by using any other known materials.

The first electrodes 1024Y, 1024R, 1024G, and 1024B of the light-emitting elements each serve as an anode here, but may serve as a cathode. Further, in the case of a light-emitting device having a top emission structure as shown in FIG. 8, the first electrodes are preferably reflective electrodes. The EL layer 1028 is formed to have a structure similar to the structure of the EL layer 103, the EL layer 103d, and the EL layer 103a in FIGS. 5A, 5B, and 5C, respectively, and an element structure with which white light emission can be obtained is employed.

For the top emission structure as shown in FIG. 8, sealing with the sealing substrate 1031 provided with the color conversion layers and the color filter layers is possible. The black layer (black matrix) 1035 may be provided on the sealing substrate 1031 so as to be located between the pixels. The color filter layers, the color conversion layers, and black layers (black matrix) may be covered with an overcoat layer 1036. Note that a light-transmitting substrate is used as the sealing substrate 1031.

Although an example in which full color display is performed using four colors of red, green, blue, and yellow is shown here, there is no particular limitation and full color display using three colors of red, green, and blue or four colors of red, green, blue, and white may be performed.

Figure 9A:
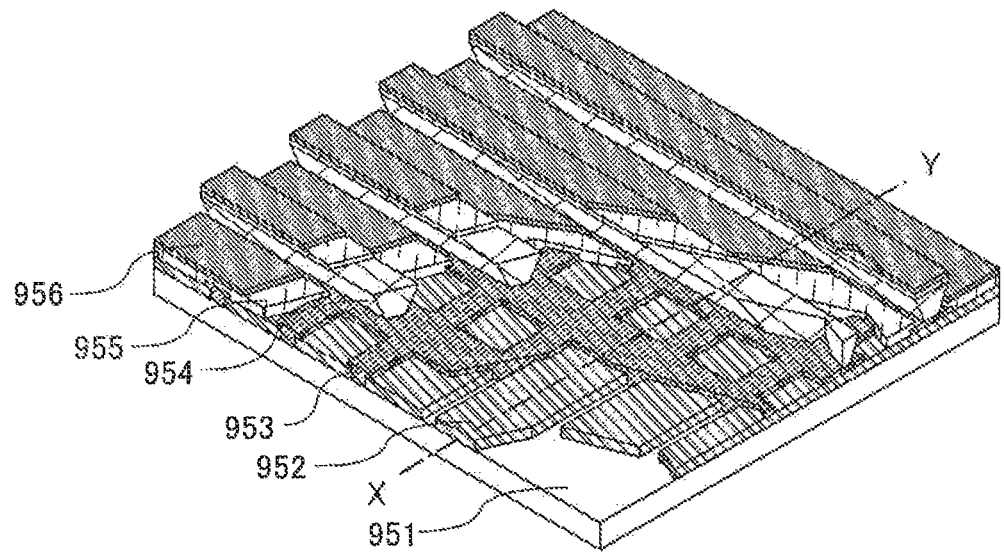
FIGS. 9A and 9B are conceptual diagrams of a passive matrix light-emitting device.
Figure 9B:
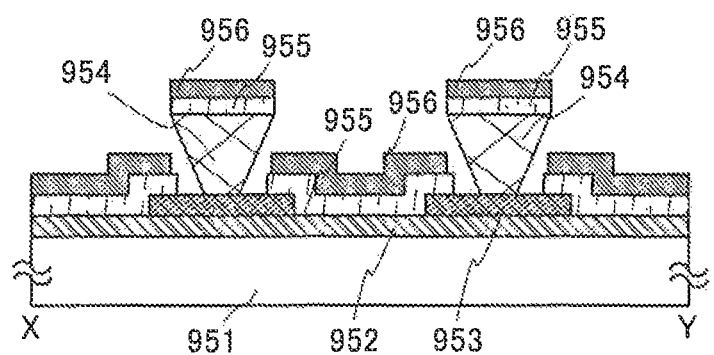

FIGS. 9A and 9B illustrate a passive matrix light-emitting device which is one embodiment of the present invention. FIG. 9A is a perspective view showing the light-emitting device, and FIG. 9B is a cross-sectional view of FIG. 9A taken along a line X-Y. In FIGS. 9A and 9B, an EL layer 955 is provided between an electrode 952 and an electrode 956 over a substrate 951. End portions of the electrode 952 are covered by an insulating layer 953. In addition, a partition layer 954 is provided over the insulating layer 953. A side wall of the partition layer 954 slopes so that a distance between one side wall and the other side wall becomes narrow toward a substrate surface. In other words, a cross section in the minor axis of the partition layer 954 is a trapezoidal shape of which the lower base (the side which is in the same direction as the plane direction of the insulating layer 953 and in contact with the insulating layer 953) is shorter than the upper base (the side which is in the same direction as the plane direction of the insulating layer 953 and not in contact with the insulating layer 953). The provision of the partition layer 954 in this manner can prevent the light-emitting element from being defective due to static electricity or the like.

Since many minute light-emitting elements arranged in a matrix can each be controlled with the FETs formed in the pixel portion, the above-described light-emitting device can be suitably used as a display device for displaying images.

<Electronic Device>

Examples of an electronic device that is one embodiment of the present invention will be described. Examples of the electronic devices are a television device (also referred to as a television or a television receiver), a monitor of a computer or the like, a camera such as a digital camera or a digital video camera, a digital photo frame, a mobile phone (also referred to as a mobile telephone or a mobile phone device), a portable game console, a portable information terminal, an audio reproducing device, a large-sized game machine such as a pachinko machine, and the like. Specific examples of these electronic devices will be given below.

Figure 10A:
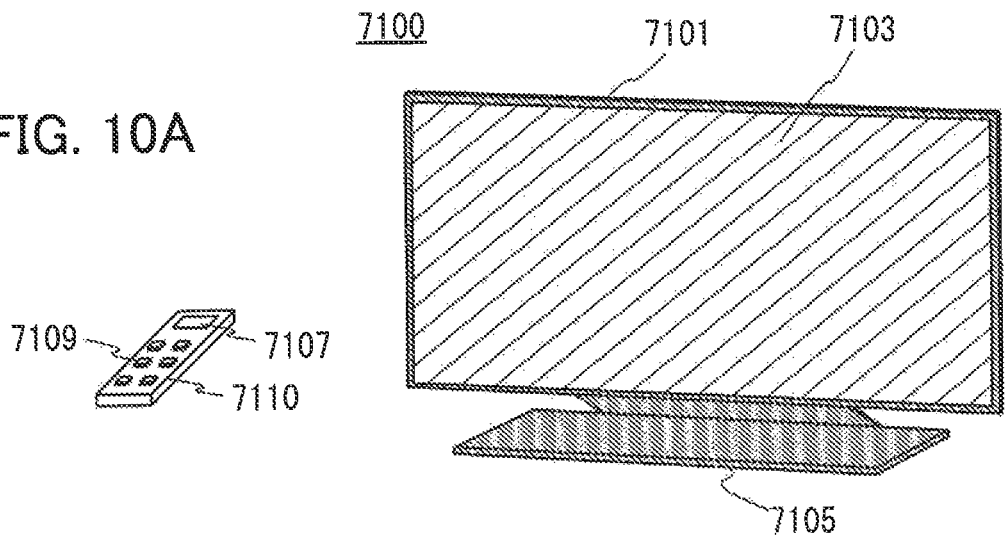
Figure 10A:
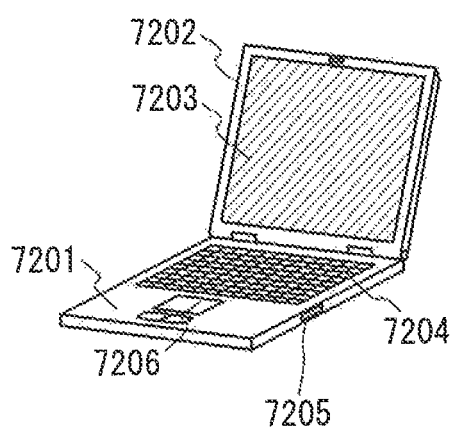
Figure 10A:
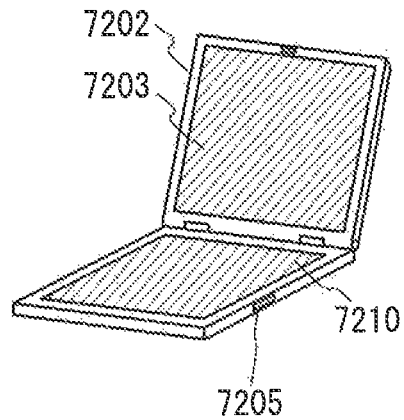

FIG. 10A shows an example of a television set. In the television device, a display portion 7103 is incorporated in a housing 7101. In addition, here, the housing 7101 is supported by a stand 7105. Images can be displayed on the display portion 7103, and in the display portion 7103, light-emitting elements are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television set is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

FIG. 10B1 shows a computer, which includes a main body 7201, a housing 7202, a display portion 7203, a keyboard 7204, an external connection port 7205, a pointing device 7206, and the like. Note that this computer is manufactured by using light-emitting elements arranged in a matrix in the display portion 7203. The computer shown in FIG. 10B1 may have a structure shown in FIG. 10B2. The computer shown in FIG. 10B2 is provided with a second display portion 7210 instead of the keyboard 7204 and the pointing device 7206. The second display portion 7210 is a touch screen, and input can be performed by operation of display for input on the second display portion 7210 with a finger or a dedicated pen. The second display portion 7210 can also display images other than the display for input. The display portion 7203 may be also a touch screen. Connecting the two screens with a hinge can prevent troubles; for example, the screens can be prevented from being cracked or broken while the computer is being stored or carried.

Figure 10C:
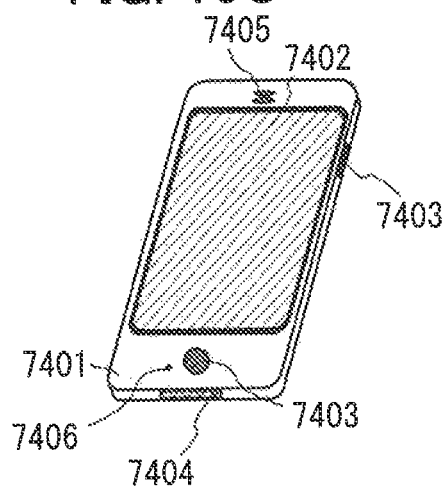
Figure 10D:
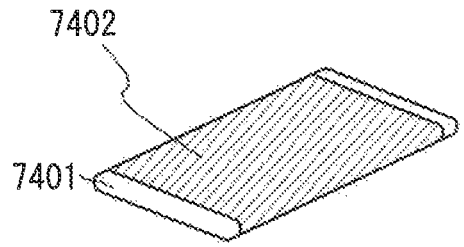

FIGS. 10C and 10D show an example of a portable information terminal. The portable information terminal is provided with a display portion 7402 incorporated in a housing 7401, an operation button 7403, an external connection port 7404, a speaker 7405, a microphone 7406, and the like. Note that the portable information terminal has the display portion 7402 including light-emitting elements arranged in a matrix.

Information can be input to the portable information terminal shown in FIGS. 10C and 10D by touching the display portion 7402 with a finger or the like. In this case, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device including a sensor for sensing inclination, such as a gyroscope or an acceleration sensor, is provided inside the portable information terminal, display on the screen of the display portion 7402 can be automatically changed by determining the orientation of the portable information terminal (whether the portable information terminal is placed horizontally or vertically for a landscape mode or a portrait mode).

The screen modes are changed by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source that emits near-infrared light in the display portion, an image of a finger vein, a palm vein, or the like can be taken.

Note that in the above electronic devices, any of the structures described in this specification can be combined as appropriate.

The display portion preferably includes a light-emitting element including an organic compound of one embodiment of the present invention. Since the light-emitting element can be a light-emitting element with high emission efficiency, the electronic device with low power consumption can be obtained. In addition, the light-emitting element can easily have high heat resistance.

Figure 11:
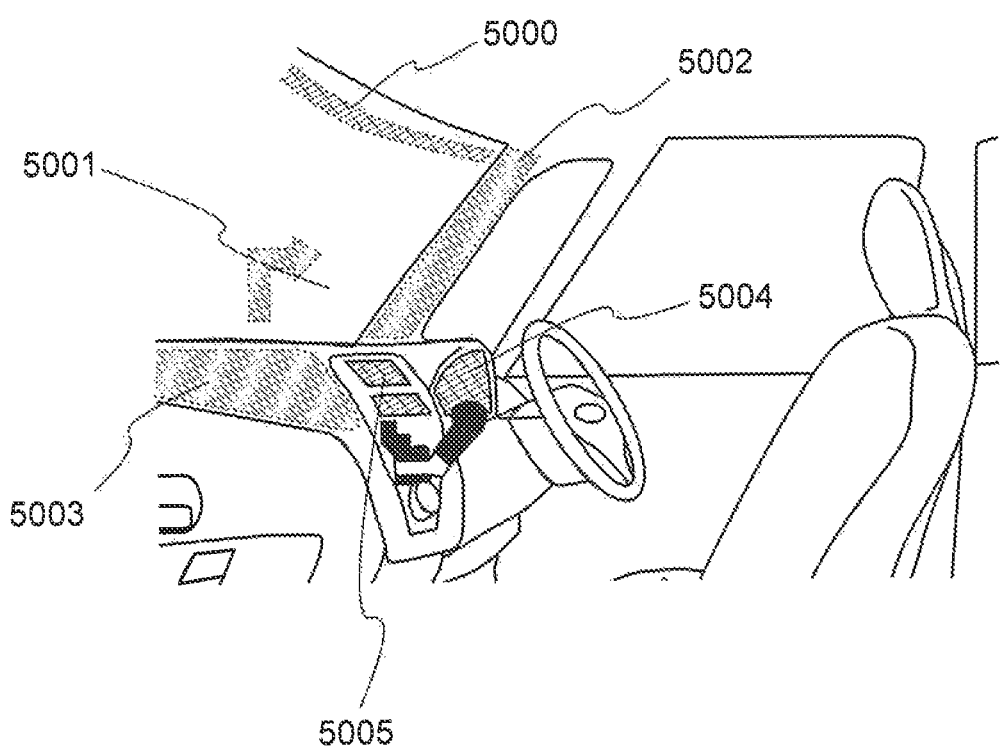
FIG. 11 illustrates in-vehicle display devices and lighting devices.

An automobile which is one embodiment of the present invention is shown in FIG. 11. In the automobile, light-emitting elements are used for a windshield and a dashboard. Display regions 5000 to 5005 are provided by using the light-emitting elements. The light-emitting elements preferably include the organic compound of one embodiment of the present invention, and can have low power consumption. This also suppresses power consumption of the display regions 5000 to 5005, showing suitability for use in an automobile.

The display regions 5000 and 5001 are provided in the automobile windshield including the light-emitting elements. When a first electrode and a second electrode are formed of electrodes having light-transmitting properties in these light-emitting elements, what is called a see-through display device, through which the opposite side can be seen, can be obtained. Such see-through light-emitting devices can be provided even in the automobile windshield without hindering the vision. Further, for example, in the case where a transistor for driving the light-emitting element is provided, it is preferable to use a transistor having a light-transmitting property, such as an organic transistor using an organic semiconductor material or a transistor using an oxide semiconductor.

The display region 5002 is provided in a pillar portion using a light-emitting element. The display region 5002 can compensate for the view hindered by the pillar portion by showing an image taken by an imaging unit provided in the car body. Similarly, the display region 5003 provided in the dashboard can compensate for the view hindered by the car body by showing an image taken by an imaging unit provided on the outside of the car body, which leads to elimination of blind areas and enhancement of safety. Showing an image so as to compensate for the area which a driver cannot see makes it possible for the driver to confirm safety easily and comfortably.

The display region 5004 and the display region 5005 can provide a variety of kinds of information such as navigation information, a speedometer, a tachometer, a mileage, a fuel meter, a gearshift indicator, and air-condition setting. The contents or layout of the display can be changed by a user as appropriate. Note that such information can also be shown by the display regions 5000 to 5003. The display regions 5000 to 5005 can also be used as lighting devices.

Figure 12A:
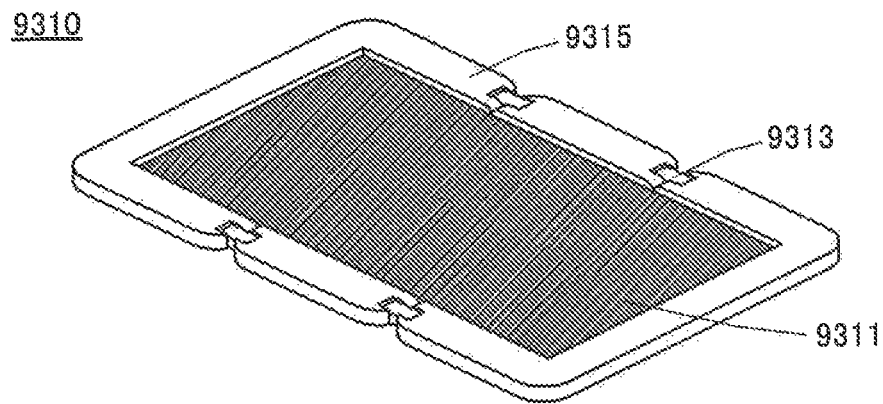
FIGS. 12A to 12C illustrate an electronic device.
Figure 12B:
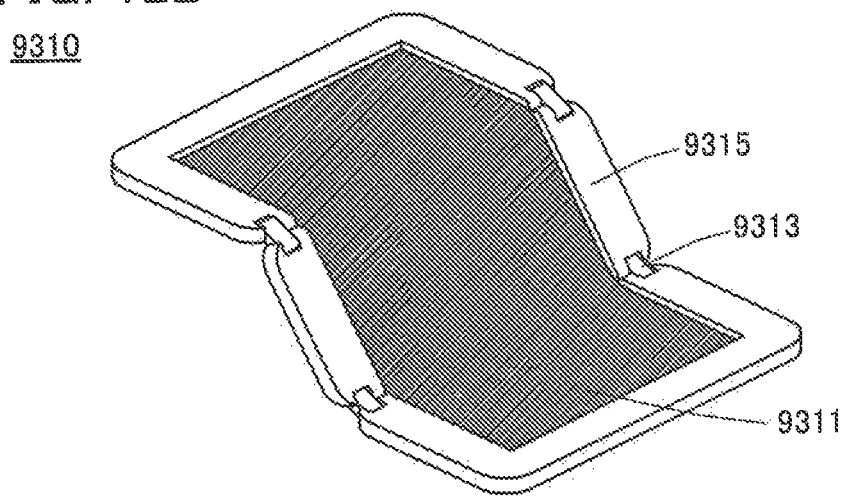
Figure 12C:
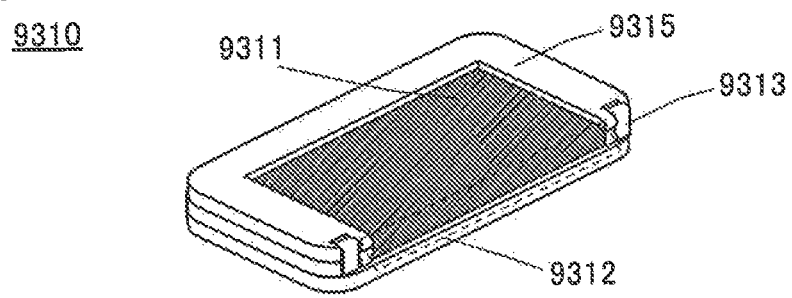

FIGS. 12A to 12C show a foldable portable information terminal 9310. FIG. 12A shows the portable information terminal 9310 that is opened. FIG. 12B shows the portable information terminal 9310 that is being opened or being folded. FIG. 12C illustrates the portable information terminal 9310 that is folded. The portable information terminal 9310 is highly portable when folded. When the portable information terminal 9310 is opened, a seamless large display region is highly browsable.

A display panel 9311 is supported by three housings 9315 joined together by hinges 9313. By folding the portable information terminal 9310 at a connection portion between two housings 9315 with the hinges 9313, the portable information terminal 9310 can be reversibly changed in shape from an opened state to a folded state. A light-emitting device of one embodiment of the present invention can be used for the display panel 9311. A display region 9312 is a display region that is positioned at a side surface of the portable information terminal 9310 that is folded. On the display region 9312, information icons, frequently-used applications, file shortcuts to programs, and the like can be displayed, and confirmation of information and start of application can be smoothly performed.

As described above, the electronic devices can be obtained by application of the light-emitting device according to one embodiment of the present invention. Note that the light-emitting device can be used for electronic devices in a variety of fields without being limited to the electronic devices described in this embodiment.

Note that the structure described in this embodiment can be combined as appropriate with any of the structures described in the other embodiments.

EXPLANATION OF REFERENCE

100: substrate, 101: sealing substrate, 102: first electrode, 102R: first electrode, 102G: first electrode, 102B: first electrode, 102Y: first electrode, 102Rt: transparent conductive film, 102Gt: transparent conductive film, 102Bt: transparent conductive film, 102Yt: transparent conductive film, 103: EL layer, 103a: EL layer, 103b: first light-emitting unit, 103c: second light-emitting unit, 103d: EL layer, 103e: first EL layer, 103f: second EL layer, 103g: third EL layer, 103h: fourth EL layer, 103i: first EL layer, 103j: second EL layer, 103k: third EL layer, 103m: fourth EL layer, 104: second electrode, 105: black matrix, 106R: color conversion layer, 106G: color conversion layer, 106Y: color conversion layer, 107G: color filter, 107B: color filter, 107Y: color filter, 109: intermediate layer, 114: hole-injection layer, 115: hole-transport layer, 116: light-emitting layer, 116d-1: first light-emitting layer, 116d-2: second light-emitting layer, 117: electron-transport layer, 118: electron-injection layer, 601: driver circuit portion (source line driver circuit), 602: pixel portion, 603: driver circuit portion (gate line driver circuit), 604: sealing substrate, 605: sealant, 607: space, 608: wiring, 609: FPC (flexible printed circuit), 610: element substrate, 611: switching FET, 612: current controlling FET, 613: first electrode, 614: insulator, 616: EL layer, 617: second electrode, 618: light-emitting element, 623: n-channel FET, 624: p-channel FET, 625: drying agent, 915: substrate, 952: electrode, 953: insulating layer, 954: partition layer, 955: EL layer, 956: electrode, 1001: substrate, 1002: base insulating film, 1003: gate insulating film, 1006: gate electrode, 1007: gate electrode, 1008: gate electrode, 1020: first interlayer insulating film, 1021: second interlayer insulating film, 1022: electrode, 1024Y: first electrode of light-emitting element, 1024R: first electrode of light-emitting element, 1024G: first electrode of light-emitting element, 1024B: first electrode of light-emitting element, 1025: partition wall, 1028: EL layer, 1029: second electrode of light-emitting element, 1031: sealing substrate, 1032: sealant, 1033: transparent base material, 1034R: red color conversion layer, 1034G: green color conversion layer, 1034B: blue color filter layer, 1034Y: yellow color conversion layer, 1035: black layer (black matrix), 1037: third interlayer insulating film, 1040: pixel portion, 1041: driver circuit portion, 1042: peripheral portion, 5000: display region, 5001: display region, 5002: display region, 5003: display region, 5004: display region, 5005: display region, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7210: second display portion, 7301: housing, 7302: housing, 7303: connection portion, 7304: display portion, 7305: display portion, 7306: speaker portion, 7307: recording medium insertion portion, 7308: LED lamp, 7309: operation key, 7310: connection terminal, 7311: sensor, 7401: housing, 7402: display portion, 7403: operation button, 7404: external connection port, 7405: speaker, 7406: microphone, 9310: portable information terminal, 9311: display panel, 9312: display region, 9313: hinge, 9315: housing This application is based on Japanese Patent Application serial no. 2014-112796 filed with Japan Patent Office on May 30, 2014 and Japanese Patent Application serial no. 2014-112849 filed with Japan Patent Office on May 30, 2014, the entire contents of which are hereby incorporated by reference.

The invention claimed is:

1. A light-emitting device comprising:
   a first light-emitting element comprising a first electrode;
   a second light-emitting element comprising a second electrode;
   a color filter over the first light-emitting element;
   a color conversion layer over the second light-emitting element,
   wherein the color filter and the color conversion layer are provided directly contacting a same surface,
   wherein the first light-emitting element and the second light-emitting element share an electro luminescent layer,
   wherein the electro luminescent layer is over each of the first electrode and the second electrode,
   wherein a third electrode is over the electro luminescent layer,
   wherein the electro luminescent layer consists of a layer comprising a light-emitting material that emits blue fluorescence and a layer comprising a light-emitting material that emits green phosphorescence,
   wherein light emitted from the first light-emitting element enters the color filter,
   wherein light emitted from the second light-emitting element enters the color conversion layer,
   wherein the color filter transmits green light, and
   wherein the color conversion layer contains a color conversion substance that emits red light.

2. The light-emitting device according to claim 1, wherein the first light-emitting element and the second light-emitting element are tandem light-emitting elements.

3. The light-emitting device according to claim 1, wherein the layer comprising the light-emitting material that emits blue fluorescence and the layer comprising the light-emitting material that emits green phosphorescence are adjacent to each other in the first light-emitting element and the second light-emitting element.

4. A light-emitting device comprising:
   a first light-emitting element;
   a second light-emitting element;
   a third light-emitting element;
   a fourth light-emitting element;
   a first color filter;
   a second color filter;
   a first color conversion layer; and
   a second color conversion layer,
   wherein the first color filter, the second color filter, the first color conversion layer, and the second color conversion layer are provided directly contacting a same surface,
   wherein the first to fourth light-emitting elements share an electro luminescent layer,
   wherein light emitted from the first light-emitting element enters the first color filter,
   wherein light emitted from the second light-emitting element enters the first color conversion layer,
   wherein light emitted from the third light-emitting element enters the second color conversion layer,
   wherein light emitted from the fourth light-emitting element enters the second color filter,
   wherein the first color filter transmits blue light,
   wherein the second color filter transmits yellow light,
   wherein the first color conversion layer contains a color conversion substance that emits green light, and wherein the second color conversion layer contains a color conversion substance that emits red light.

5. The light-emitting device according to claim 4, wherein the electro luminescent layer consists of a layer comprising a light-emitting material that emits blue fluorescence and a layer comprising a light-emitting material that emits green phosphorescence.

6. The light-emitting device according to claim 5, wherein the layer comprising the light-emitting material that emits blue fluorescence and the layer comprising the light-emitting material that emits green phosphorescence are adjacent to each other in the first to fourth light-emitting elements.

7. The light-emitting device according to claim 4, wherein the first light-emitting element and the second light-emitting element are tandem light-emitting elements.

* * * * *